United States Patent
Takeda et al.

(10) Patent No.: US 7,401,177 B2
(45) Date of Patent: Jul. 15, 2008

(54) DATA STORAGE DEVICE, DATA STORAGE CONTROL APPARATUS, DATA STORAGE CONTROL METHOD, AND DATA STORAGE CONTROL PROGRAM

(75) Inventors: Naoki Takeda, Tokyo (JP); Tetsujiro Kondo, Tokyo (JP); Kenji Takahashi, Kanagawa (JP); Hiroshi Sato, Tokyo (JP); Tsutomu Ichikawa, Tokyo (JP); Hiroki Tetsukawa, Kanagawa (JP); Masaki Handa, Kanagawa (JP)

(73) Assignee: Sony Corporation, Tokyo (JP)

( * ) Notice: Subject to any disclaimer, the term of this patent is extended or adjusted under 35 U.S.C. 154(b) by 402 days.

(21) Appl. No.: 11/093,150

(22) Filed: Mar. 30, 2005

(65) Prior Publication Data
US 2005/0232027 A1 Oct. 20, 2005

(30) Foreign Application Priority Data
Apr. 19, 2004 (JP) ............................. 2004-123466

(51) Int. Cl.
*G06F 12/00* (2006.01)
(52) U.S. Cl. ......................................... 711/5
(58) Field of Classification Search ............. 711/5
See application file for complete search history.

(56) References Cited

U.S. PATENT DOCUMENTS

| 5,717,441 | A | * | 2/1998 | Serizawa et al. | ............ 345/573 |
| 5,828,423 | A | * | 10/1998 | Serizawa et al. | ............ 348/699 |
| 6,181,632 | B1 | * | 1/2001 | Kondo et al. | ........... 365/230.03 |
| 2003/0016748 | A1 | * | 1/2003 | Hwang et al. | .......... 375/240.12 |
| 2004/0181503 | A1 | * | 9/2004 | Moseler et al. | ................ 707/1 |

* cited by examiner

*Primary Examiner*—Matthew Kim
*Assistant Examiner*—Sheng-Jen Tsai
(74) *Attorney, Agent, or Firm*—Oblon, Spivak, McClelland, Maier & Neustadt, P.C.

(57) ABSTRACT

A data storage device includes a memory including a plurality of memory banks, a data storage processor that initially arranges data in the plurality of memory banks based on an access pattern including a plurality of desired pixels of data to be read simultaneously so as to store pixels of data between access candidates constituting the access pattern in an identical memory bank, and a data read and storage processor that reads the data initially arranged in the plurality of memory banks of the memory. The data read and storage processor reads a pixel of data from a memory bank, and stores the read pixel of data in a memory bank in which pixels of data in an adjacent range defined in ranges, which are defined by locations of the access candidates of the access pattern, based on a direction in which the access pattern is moved.

8 Claims, 29 Drawing Sheets

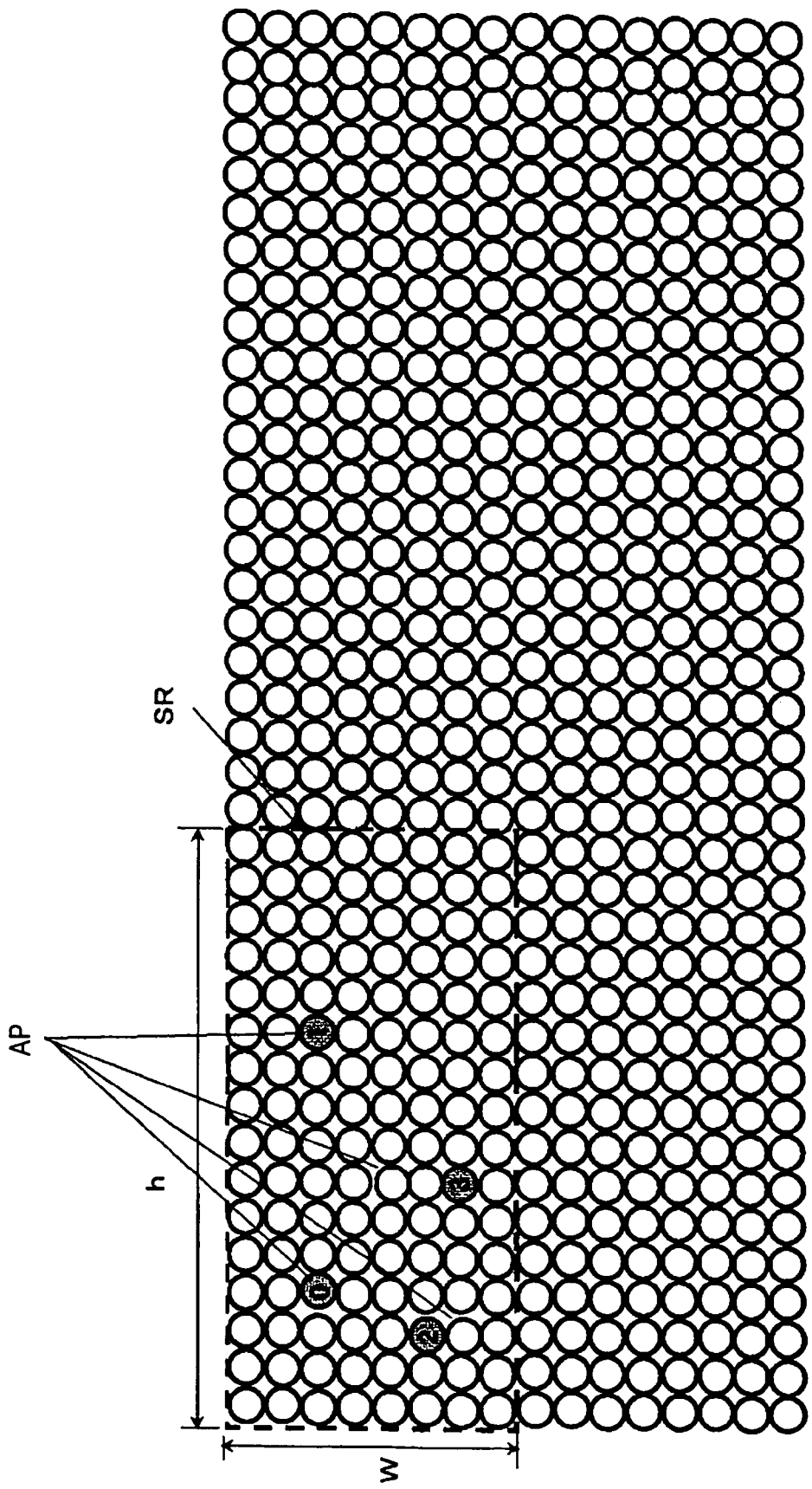

DATA STORAGE DEVICE, DATA STORAGE CONTROL APPARATUS, DATA STORAGE CONTROL METHOD, AND DATA STORAGE CONTROL PROGRAM

CROSS REFERENCES TO RELATED APPLICATIONS

The present invention contains subject matter related to Japanese Patent Application JP 2004-123466 filed in the Japanese Patent Office on Apr. 19, 2004, the entire contents of which are incorporated herein by reference.

BACKGROUND OF THE INVENTION

1. Field of the Invention

The present invention relates to a data storage device, a data storage control apparatus, a data storage control method, and a data storage control program in which data is stored in a memory including a plurality of memory banks and a plurality of desired portions of the data are read simultaneously.

2. Description of the Related Art

As shown in FIG. 19, a semiconductor memory is configured to access a memory cell MC by designating a word line WL and a bit line BL, and data stored in a memory cell MC located at an intersection of a word line and a bit line that are activated is read.

In the semiconductor memory having such a configuration, one bit line is shared by a plurality of word lines of data. As shown in FIG. 20, if a plurality of word lines WL1 and WL2 are designated, data on a bit line defined by the designated word lines WL1 and WL2 is broken, and it may therefore be impossible to simultaneously access different word lines of data.

It is possible to simultaneously read data from independent memory banks. As shown in FIG. 21, a memory is divided into n memory banks BK0 to BKn-1, and these memory banks are assigned different addresses so that a plurality of word lines of data are simultaneously accessed. However, it may be impossible to simultaneously access different word lines of data in a memory bank. It is therefore possible to simultaneously read data stored on the same word line from memory banks, whereas it is impossible to simultaneously read data stored on different word lines in one memory bank.

Here, the memory bank is an area having a fixed capacity, which is used as a unit for managing the memory. Therefore, access conflicts of data do not occur between independent memory banks. The memory is composed of one or more memory banks.

In the related art, a specific data sequence contained in input data is identified for image data processing, e.g., pattern recognition.

In the related art, a specific data sequence contained in input data is also identified for image data processing, e.g., pattern recognition and motion detection.

For example, a data conversion device disclosed in Japanese Unexamined Patent Application Publication No. 2003-203236 includes a buffer memory that stores several lines of image data and that outputs the image data in units of pixels, a data processor that includes a plurality of processor elements capable of processing several bits of data and that simultaneously processes the data in parallel using the plurality of processor elements, and a control information memory that stores matching reference data and control data. In this data conversion device, each of the processor elements of the data processor converts a matrix of image data groups in the image data output from the buffer memory that is centered around a given pixel allocated to this processor element into target binary data using a threshold value so that the binary data is divided into serial bits of data so as to be processed by this processor element. It is determined whether or not a match is found between the binary data and the reference data stored in the same form in the control information memory.

In the field of video processing, motion, that is, the motion direction and size (or speed), of an object in different images separated in time is used. The motion is used for, for example, motion compensation inter-frame coding for use in high-efficiency video coding and for parameter control in the case of motion performed using an inter-frame temporal filter in a television noise reduction system. One known motion detection method for detecting motion is a block matching method.

A two-step motion detection method for detecting motion in an image signal has been proposed by Sony Corporation, including (a) a step of extracting one or a plurality of candidate vectors for each screen or each relatively large block divided from one screen using an accumulation table that is generated for each screen or each relatively large block divided from one screen using matching, and (b) a step of performing matching on the candidate vector or vectors to detect a motion vector for each pixel or each relatively small block. In the two-step motion detection method, it is necessary to simultaneously read a plurality of arbitrary pixels of data in an image in the two-step operation including representative point matching for detecting motion of the image using two-step representative point matching and vector allocation (see Japanese Unexamined Patent Application Publication No. 2001-61152).

SUMMARY OF THE INVENTION

For example, as shown in FIG. 22A, when an image includes a pattern of four pixels to be simultaneously accessed, as shown in FIG. 22B, the number of memory banks necessary for separately storing the desired pixels is four. If a search region SR of height (h pixels) by width (w pixels) includes n arbitrary candidates to be accessed, $_{(h \times w)}C_{(n)}$ sets of candidates exist. Each set of candidates is referred to as an access pattern. An access pattern may include a set of an arbitrary number of access candidates in a search region. FIGS. 22A and 22B show one of $_{16 \times 8}C_4$ sets.

Since a pattern to be accessed is moved in the scanning order, it is necessary to design the initial arrangement of pixels other than the access pixels.

For example, as shown in FIG. 23, pixels between access candidates are stored one-by-one into different memory banks. Alternatively, as shown in FIG. 24, pixels between access candidates are stored in the same memory bank.

If pixels between access candidates are stored in the same memory bank, as shown in FIGS. 25A, 25B, and 25C, pixels are simultaneously accessible to some extent even if the pattern is moved in the scanning order.

However, as shown in FIG. 26, if the access pattern moves into a range defined between access pixels, pixels in the same memory bank are to be simultaneously accessed.

In order to allow these pixels of data to be simultaneously accessed, it is conceivable to store this data in different memory banks or to store this data in the same word line. Some patterns of pixels may be simultaneously accessible by appropriately selecting storage locations. In order to simultaneously access any pattern of pixels, it is necessary to divide a memory into small memory banks so that each divided memory bank is composed of one word line. However, the smaller memory banks a memory is divided into, the larger the number of memory banks. A large number of memory banks cause following problems:

the memory banks are allocated different addresses, and therefore the size of the address bus increases;

the number of decoders and selectors corresponding to the number of memory banks is necessary, and therefore the chip size increases;

the plurality of memory banks operate at the same time, and therefore the power consumption increases; and if the amount of data on one word line increases, the word line length increases, and therefore it takes more time to access the data on one word line.

Accordingly, a semiconductor memory is capable of simultaneously reading data if one memory bank is composed of one word line. However, a large amount of data stored in each memory bank places a burden on the hardware, which is not practical.

In the related art, therefore, a buffer or cache for temporarily storing data and reading the stored data is used, and a plurality of desired portions of data into which data is divided in time are temporarily stored in and read from the buffer or cache.

If the number of desired portions of data to be handled increases and the data is input and output at a high rate, reading of the data becomes slow. Although it is conceivable to increase the number of buffers or caches to overcome this problem, a large space for the buffers or caches places a burden on the hardware.

It is therefore desirable to provide a data storage device, a data storage control apparatus, a data storage control method, and a data storage control program in which data is stored in a memory including a plurality of memory banks and a plurality of desired portions of the data are read simultaneously without placing a burden on the hardware.

Other features and advantages of the present invention will become apparent from the following description.

According to an embodiment of the present invention, there is provided a data storage device including a memory including a plurality of memory banks, a data storage processor that initially arranges data in the plurality of memory banks of the memory based on an access pattern so that pixels of data between access candidates constituting the access pattern are stored in an identical memory bank. The access pattern includes a plurality of desired pixels of data to be read simultaneously. The data storage device also includes a data read and storage processor that reads the data initially arranged in the plurality of memory banks of the memory so as to read pixels of data from the memory banks. The data read and storage processor reads a pixel of data from a memory bank, and stores the read pixel of data in a memory bank in which pixels of data in an adjacent range that is defined in ranges based on a direction in which the access pattern is moved are stored. The ranges are defined by locations of the access candidates of the access pattern.

According to an embodiment of the present invention, there is provided a data storage control apparatus including a data storage processor that initially arranges data in a plurality of memory banks constituting a memory based on an access pattern so that pixels of data between access candidates constituting the access pattern are stored in an identical memory bank. The access pattern includes a plurality of desired pixels of data to be read simultaneously. The data storage control apparatus also includes a data read and storage processor that reads the data initially arranged in the plurality of memory banks of the memory so as to read pixels of data from the memory banks. The data read and storage processor reads a pixel of data from a memory bank, and stores the read pixel of data in a memory bank in which pixels of data in an adjacent range that is defined in ranges based on a direction in which the access pattern is moved are stored. The ranges are defined by locations of the access candidates of the access pattern.

According to an embodiment of the present invention, there is provided a data storage control method including the steps of initially arranging data in a plurality of memory banks constituting a memory based on an access pattern so that pixels of data between access candidates constituting the access pattern are stored in an identical memory bank, the access pattern including a plurality of desired pixels of data to be read simultaneously, reading from a memory bank a pixel of data in the data initially arranged in the plurality of memory banks of the memory, and storing the read pixel of data in a memory bank in which pixels of data in an adjacent range that is are stored, the adjacent range being defined in ranges based on a direction in which the access pattern is moved, the ranges being defined by locations of the access candidates of the access pattern.

According to an embodiment of the present invention, there is provided a data storage control program including the steps of initially arranging data in a plurality of memory banks constituting a memory based on an access pattern so that pixels of data between access candidates constituting the access pattern are stored in an identical memory bank, the access pattern including a plurality of desired pixels of data to be read simultaneously, reading from a memory bank a pixel of data in the data initially arranged in the plurality of memory banks of the memory, and storing the read pixel of data in a memory bank in which pixels of data in an adjacent range are stored, the adjacent range being defined in ranges based on a direction in which the access pattern is moved, the ranges being defined by locations of the access candidates of the access pattern.

According to an embodiment of the present invention, therefore, a plurality of desired pixels in all data are simultaneously accessed using a minimum number of memory banks while minimizing the size of address bus, the number of selectors and decoders, and the power consumption.

BRIEF DESCRIPTION OF THE DRAWINGS

FIG. 4 is a schematic diagram of an access pattern of a plurality of pixels to be accessed simultaneously in an image;

DESCRIPTION OF THE PREFERRED EMBODIMENTS

Embodiments of the present invention will now be described in detail with reference to the drawings. The present invention is not limited to the following embodiments, and a variety of modifications may be made without departing from the scope of the present invention.

Figure 1:
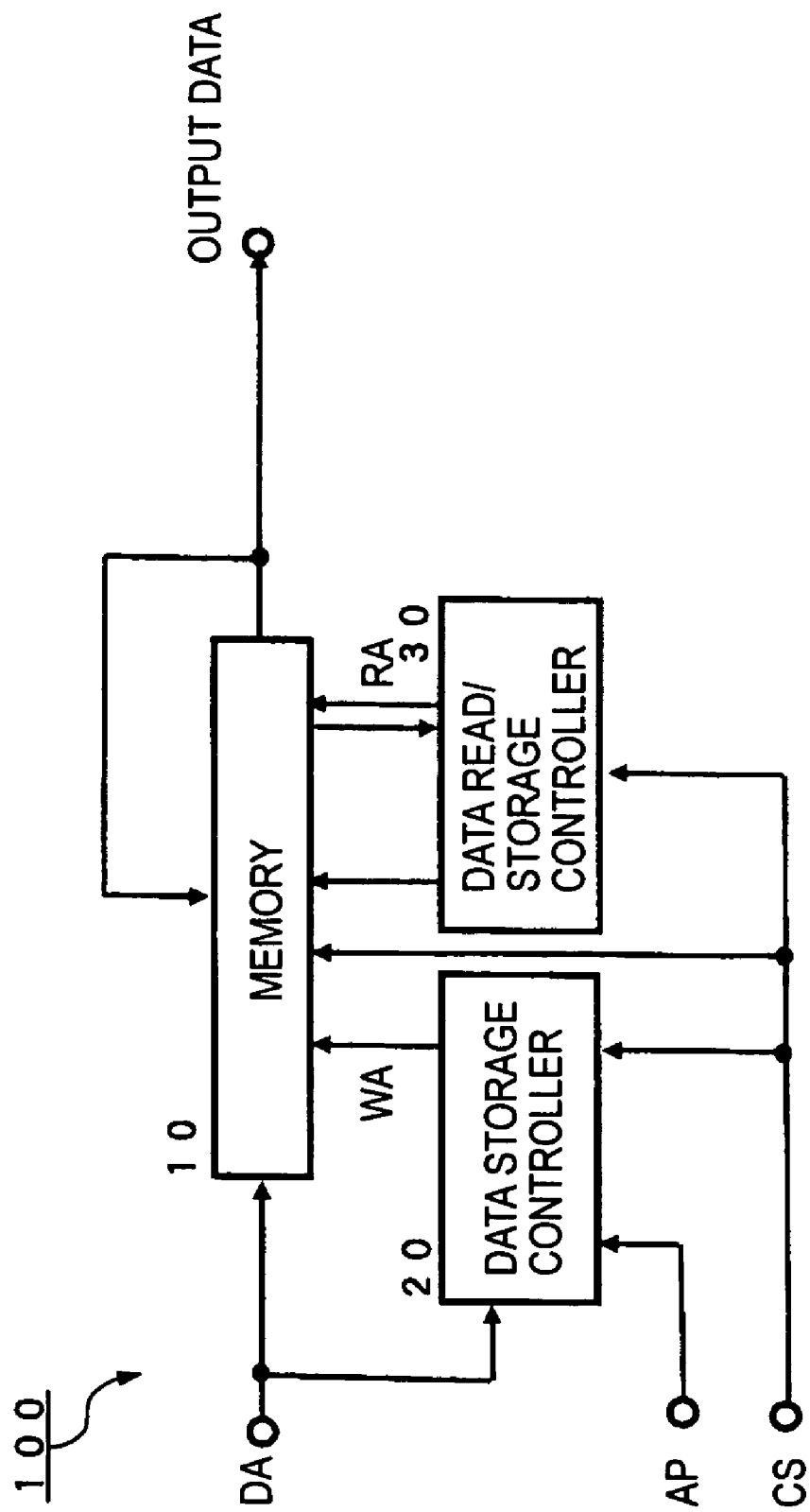
FIG. 1 is a block diagram of a data storage device according to an embodiment of the present invention.

FIG. 1 shows a data storage device 100 according to an embodiment of the present invention.

The data storage device 100 includes a memory 10 having a plurality of memory banks, a data storage controller 20 for writing data DA, such as image data, to the memory 10, and a data read/storage controller 30 for controlling reading of data from the memory 10 and controlling pixel refreshment. The input data DA to be stored is supplied to the memory 10 and the data storage controller 20, and an access pattern AP indicating a plurality of sets of data to be simultaneously read is supplied to the data storage controller 20. A control signal for controlling an operation is supplied to the memory 10, the data storage controller 20, and the data read/storage controller 30.

Figure 2:
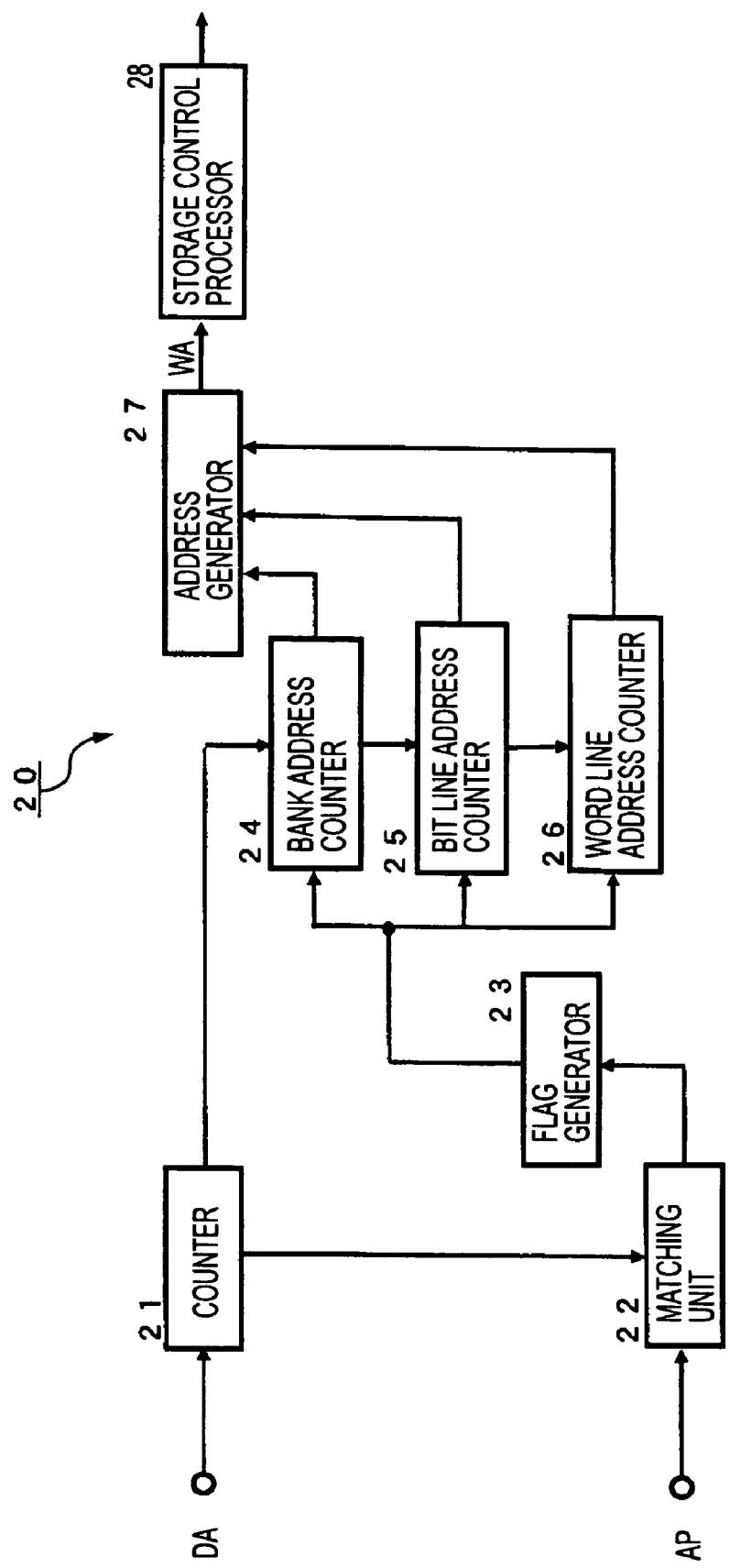
FIG. 2 is a block diagram of a data storage controller in the data storage device.

As shown in FIG. 2, the data storage controller 20 includes a counter 21 that counts the supplied data DA, a matching unit 22 that determines whether or not a match is found between an output count of the counter 21 and the access pattern AP, a flag generator 23 that generates a flag indicating a determination result output from the matching unit 22, a bank address counter 24 that is incremented in response to an output of the counter 21, a bit line address counter 25 that is incremented in response to an output of the bank address counter 24, a word line address counter 26 that is incremented in response to an output of the bit line address counter 25, an address generator 27 that generates a write address WA based on outputs of the counters 24, 25, and 26, and a storage control processor 28 that controls writing to the memory 10 in response to the write address WA. The output of the flag generator 23 is supplied to the bank address counter 24, the bit line address counter 25, and the word line address counter 26. The data DA is delayed by a predetermined period of time by a delay unit (not shown), and the storage control processor 28 causes the delayed data DA to be stored at an address in the memory 10 that is given by the write address WA.

Figure 3:
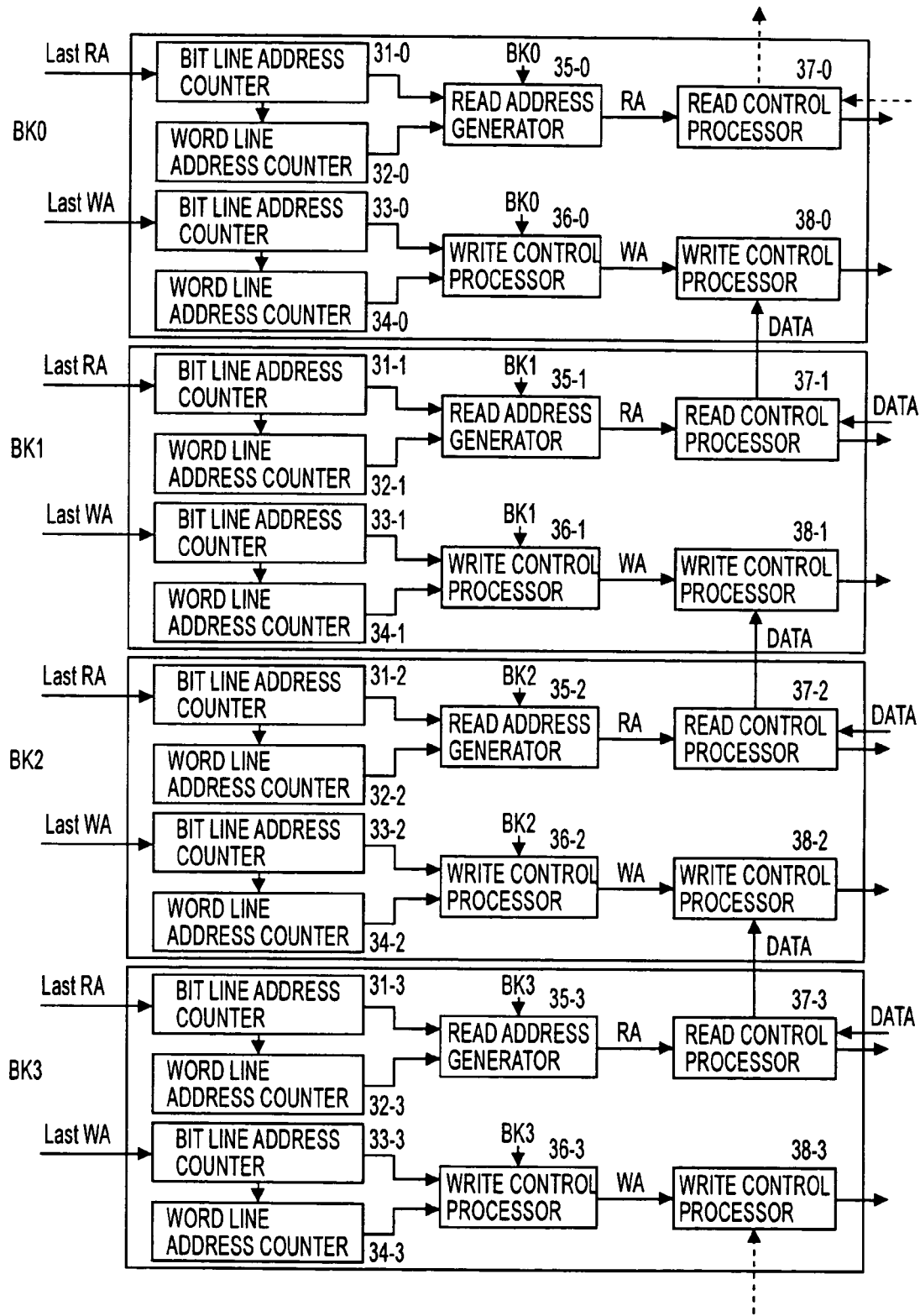
FIG. 3 is a block diagram of a data read/storage controller in the data storage device.

For example, in the case of four memory banks BK0 to BK3, as shown in FIG. 3, the data read/storage controller 30 includes bit line address counters 31-0 to 31-3 and word line address counters 32-0 to 32-3 for reading data, bit line address counters 33-0 to 33-3 and word line address counters 34-0 to 34-3 for storing data, read address generators 35-0 to 35-3 for generating read addresses, write address generators 36-0 to 36-3 for generating write addresses, read control processors 37-0 to 37-3 for controlling a read operation, and write control processors 38-0 to 38-3 for controlling a write operation.

For example, the last read addresses of the memory banks BK0 to BK3 that are read from the memory 10 are input to the bit line address counters 31-0 to 31-3, and the word line address counters 32-0 to 32-3 are incremented in response to the read addresses. The read address generators 35-0 to 35-3 generate read addresses RA based on the bank addresses, the bit line address counters 31-0 to 31-3, and the word line address counters 32-0 to 32-3. The read control processors 37-0 to 37-3 read the data corresponding to the read addresses RA from the memory 10.

Likewise, for example, the last write addresses of the memory banks BK0 to BK3 that are read from the memory 10 are input to the bit line address counters 33-0 to 33-3, and the word line address counters 34-0 to 34-3 are incremented in response to the write addresses. The write address generators 36-0 to 36-3 generate write addresses WA based on the bank addresses, the bit line address counters 33-0 to 33-3, and the word line address counters 34-0 to 34-3. The write control processors 38-0 to 38-3 write data that is read from other memory banks (e.g., the memory banks subsequent to the memory banks BK0 to BK3) at a predetermined location in the memory 10 that is given by the write addresses WA.

Although the last read addresses and the last write addresses are read from the memory 10, this is merely an example. The last read addresses and the last write addresses may be stored in and read from the data read/storage controller 30.

Although a bit line address counter and word line address counter for reading data are provided for each memory bank, the bit line address counter and the word line address counter may be shared by each memory bank because the count values of the bit line address counter and the word line address counter are the same when each memory bank is accessed.

Although the value read from a memory bank subsequent to a given memory bank is written to the given memory bank, if data read in the memory bank BK0 is to be needed again, the data read in the memory bank BK0 may be written to the memory bank BK3.

Initial arrangement of image data in memory banks in the data storage device 100 will now be described.

As shown in FIG. 4, an image includes a pattern (or an access pattern AP) corresponding to a plurality of pixels to be accessed simultaneously, and is raster-scanned from the uppermost leftmost pixel, by way of example. In this example, four pixels are simultaneously accessed using the memory 10 composed of four memory banks allocated bank addresses BK0 to BK3. An access pattern corresponding to a plurality of pixels to be accessed simultaneously is not limited to that shown in FIG. 4. As described above, if a search region SR of height (h pixels) by width (w pixels) includes n arbitrary candidates to be accessed, $_{(h \times w)}C_{(n)}$ sets of candidates exist. Each set of candidates is referred to as an access pattern. An access pattern may include a set of an arbitrary number of access candidates in a search region. FIG. 4 shows one of $_{16 \times 8}C_4$ sets.

The number of pixels to be accessed simultaneously is referred to as "the number of access candidates", and is equal to the number of candidates constituting an access pattern. In the example show in FIG. 4, the access pattern is formed of four candidates, and the number of access candidates is therefore four.

Figure 5A:
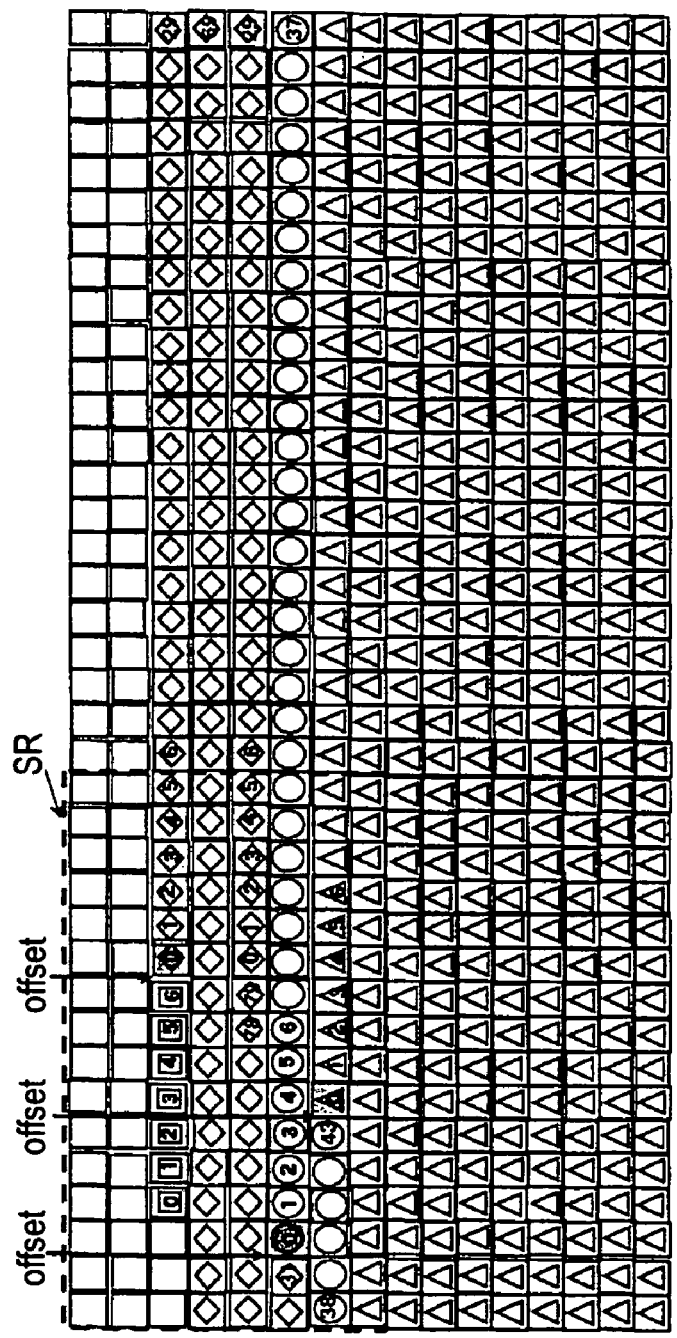
FIGS. 5A and 5B are schematic diagrams showing initial data arrangement in the data storage device.
Figure 5B:
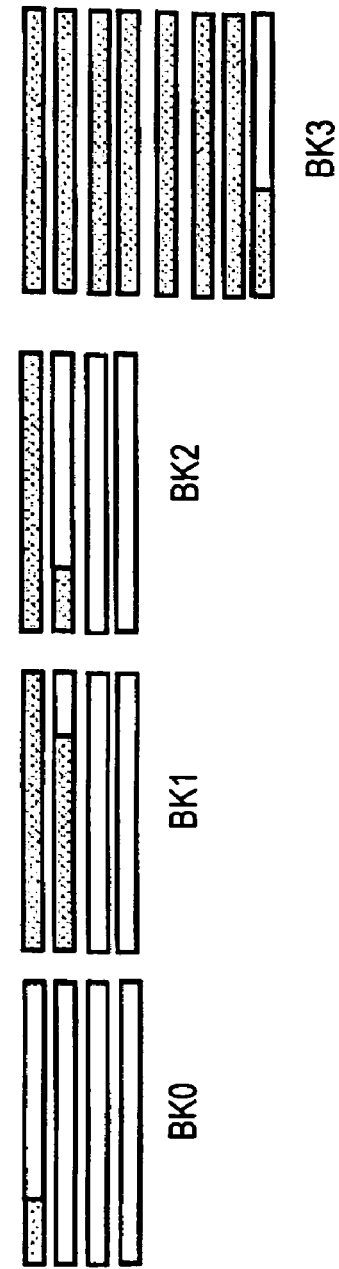

In the data storage device 100, the data storage controller 20 performs initial arrangement on input image data. If a match is found between a given pixel of the image data and the access pattern, the current value of the bit line address counter 25 and the current value of the word line address counter 26 are stored as a write bit line address and a write word line address of this bank, respectively. Then, the bank address counter 24 is incremented, and the pixel is stored at the incremented bank address. If the given pixel is not matched to the access pattern, the pixel is stored at the current bank address at a bit address location corresponding to the value of the bit line address counter 25 being incremented. If all bit line addresses are exhausted, the bit line address counter 25 is reset to zero, and the word line address counter 26 is incremented. Thus, as shown in, for example, FIGS. 5A and 5B, the pixels between the access candidates are stored in the same bank. When the pixels are stored in memory banks one-by-one from the uppermost leftmost pixel in the image, the data storage controller 20 increments the bank address each time a pixel is matched to the access pattern, and stores pixels between access candidates in the same bank in the order of bank 1 (BK1), bank 2 (BK2), and bank 3 (BK3). FIG. 5A shows an initial two-dimensional arrangement of the data, and FIG. 5B shows a one-dimensional arrangement in the memory banks BK0 to BK3. In FIG. 5A, a number represents a bit line address number in a memory bank in which a pixel is stored.

That is, in a state where an access pattern is set at an access start position, a match between the access pattern and the image data is checked for.

Figure 6:
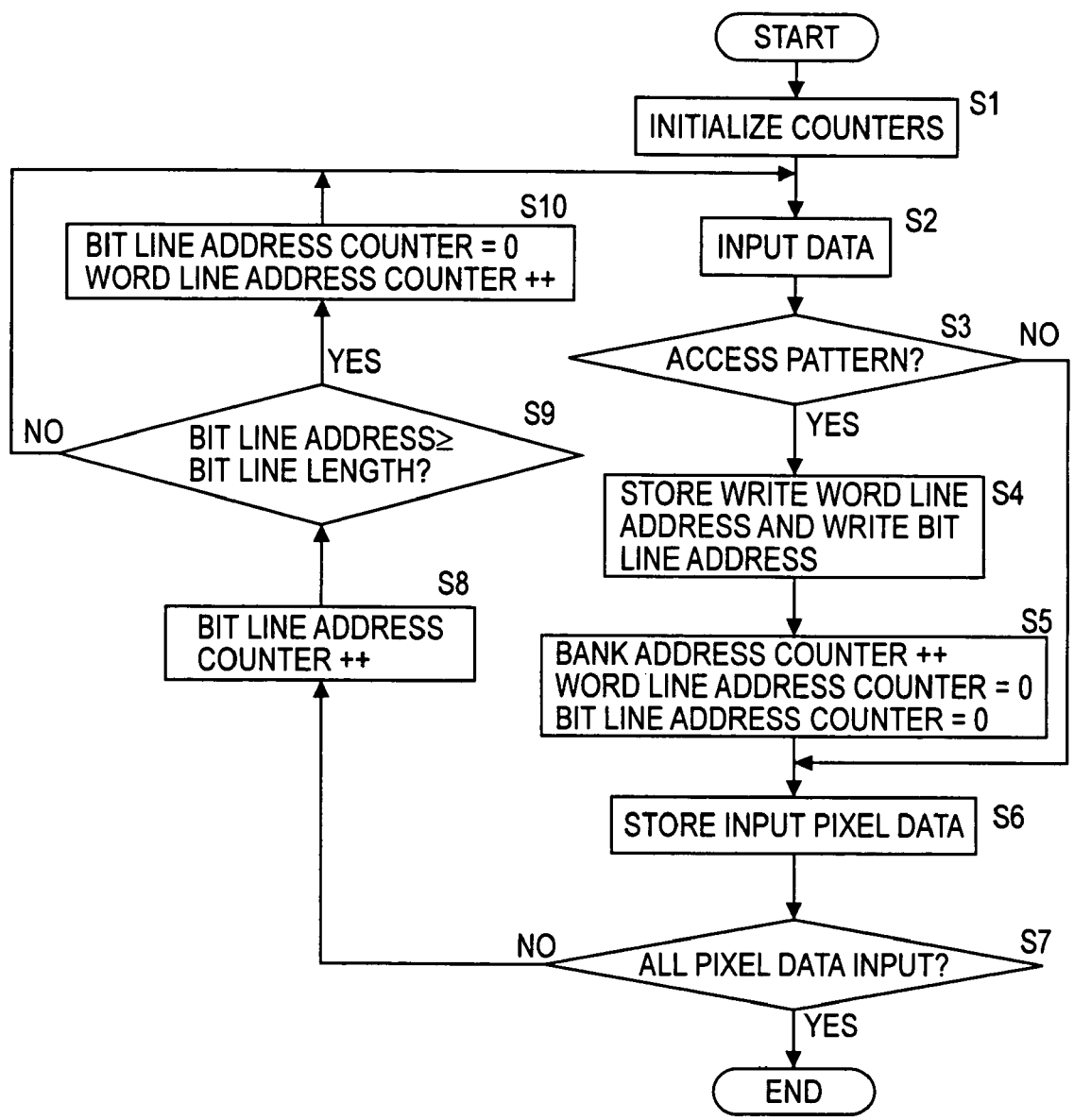
FIG. 6 is a flowchart showing an initial arrangement process performed by the data storage controller.

In the data storage device 100, the data storage controller 20 is configured by, for example, a microprocessor, and performs an initial arrangement process according to a data storage control program stored in a program memory (not shown) taken with reference to a flowchart shown in FIG. 6.

When the initial arrangement process starts, first, the data storage controller 20 initializes the bank address counter 24, the bit line address counter 25, and the word line address counter 26 to zero (step S1).

When one pixel of image data to be stored is input (step S2), the matching unit 22 checks for matching between the input image data and an access pattern (step S3). If no match is found, this pixel of image data is stored in the memory 10 at a write address defined by the current values of the bank address counter 24, the bit line address counter 25, and the word line address counter 26 (step S6). Then, it is determined whether or not all pixels of data have been input (step S7).

If all pixels of data have not been input (No in step S7), the bit line address counter 25 is incremented (step S8), and it is determined whether or not the value of the bit line address counter 25 is greater than the bit line length (step S9).

If it is determined that the bit line address is smaller than the bit line length (No in step S9), the process returns to step S2, and a following pixel of image data is input for storage. If it is determined that the bit line address is equal to or greater than the bit line length (Yes in step S9), the bit line address counter 25 is reset to zero, and the word line address counter 26 is incremented (step S10). Then, the process returns to step S2, and a following pixel of image data is input for storage.

If the input image data is matched to the access pattern (Yes in step S3), the values of the word line address counter 26 and the bit line address counter 25 are stored as the word line address and bit line address of this bank address, respectively (step S4). Then, the bank address counter 24 is incremented, and the word line address counter 26 and the bit line address counter 25 are reset to zero (step S5). Then, in step S6, this pixel of image data is stored in the memory 10 at a write address at which the values of the bank address counter 24, the word line address counter 25, and the bit line address counter 26 are indicated by "0".

The processing of steps S1 to S10 is repeatedly performed until all pixels of data are stored. When all pixels of data have been input in step S7, the initial arrangement process ends.

Then, accessing of a desired access pattern of pixels and data rearrangement will now be described.

Figure 7A:
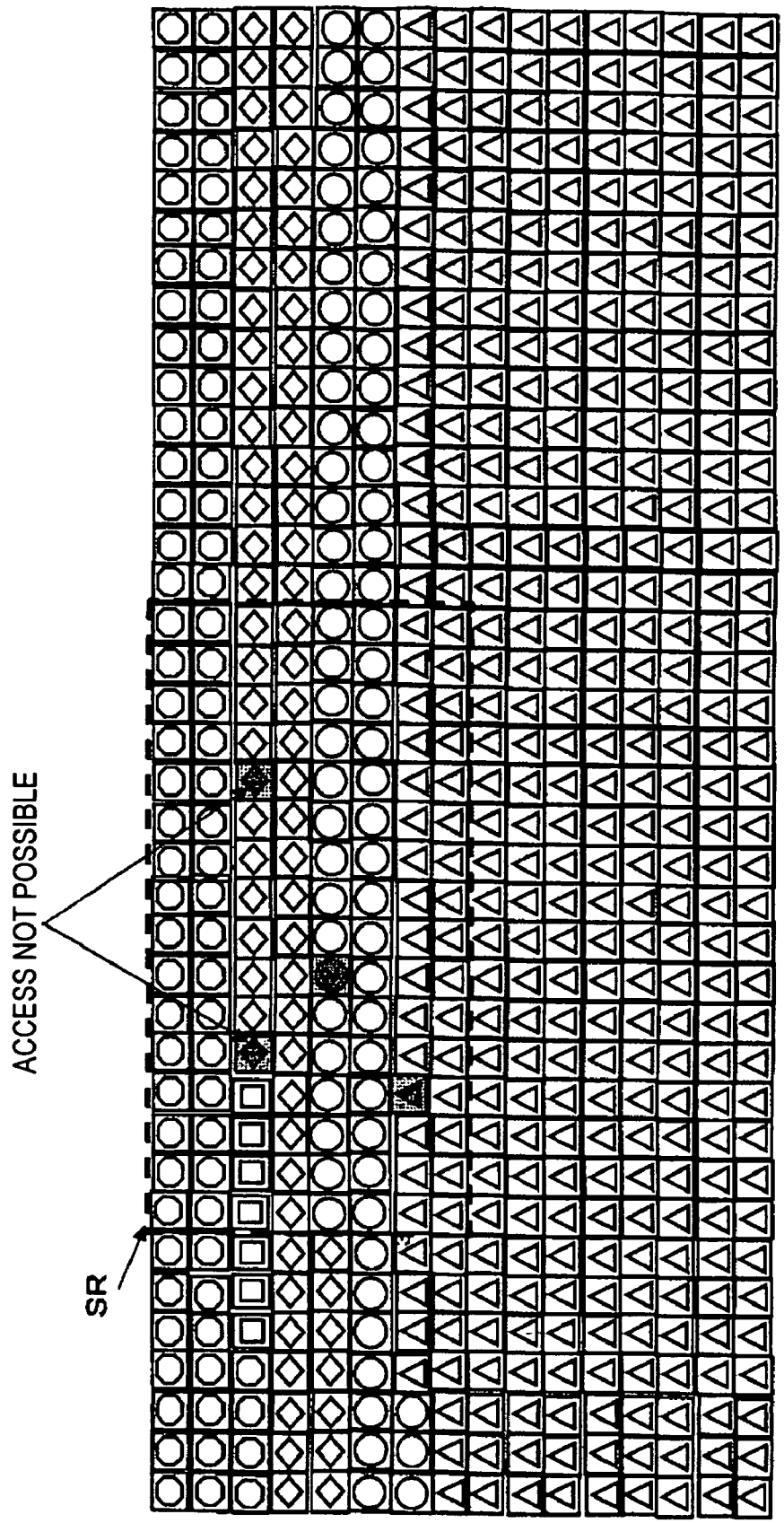
FIGS. 7A and 7B are schematic diagrams showing data rearrangement in the data storage device according to movement of the access pattern so as to simultaneously read a plurality of pixels of image data.
Figure 7B:
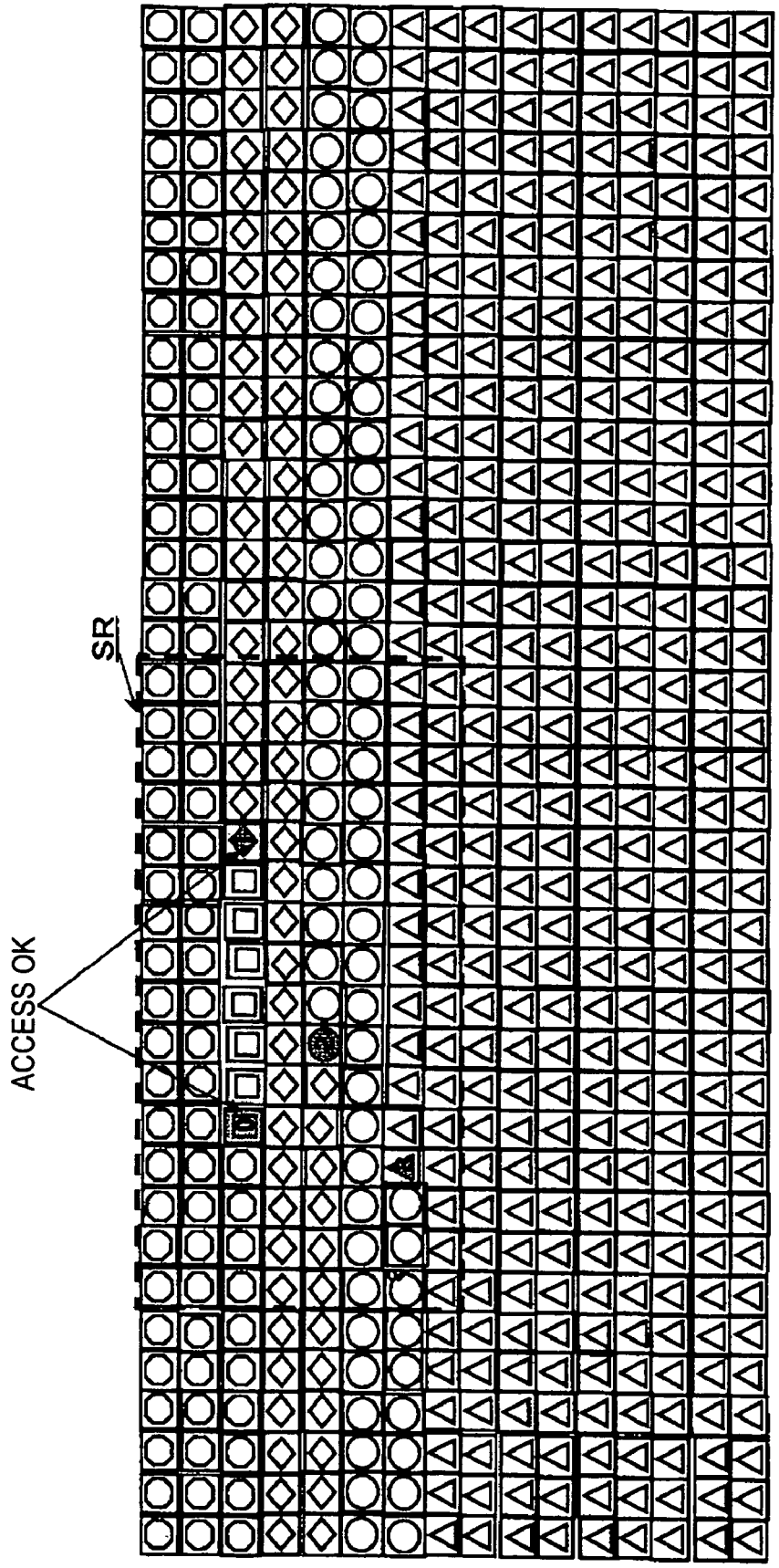

In the data storage device 100, as described above, pixels of image data are initially arranged into the memory 10 so that pixels between access candidates are stored in the same memory bank. In this case, pixels are simultaneously accessible to some extent even if the access pattern moves in the scanning order. However, as shown in FIG. 7A, if the access pattern moves into a range defined between the access pixels, pixels in the same memory bank are to be simultaneously accessed. As shown in FIG. 7B, the accessed pixels of image data are rearranged so that these pixels are simultaneously accessible if the access pattern moves.

Figure 8:
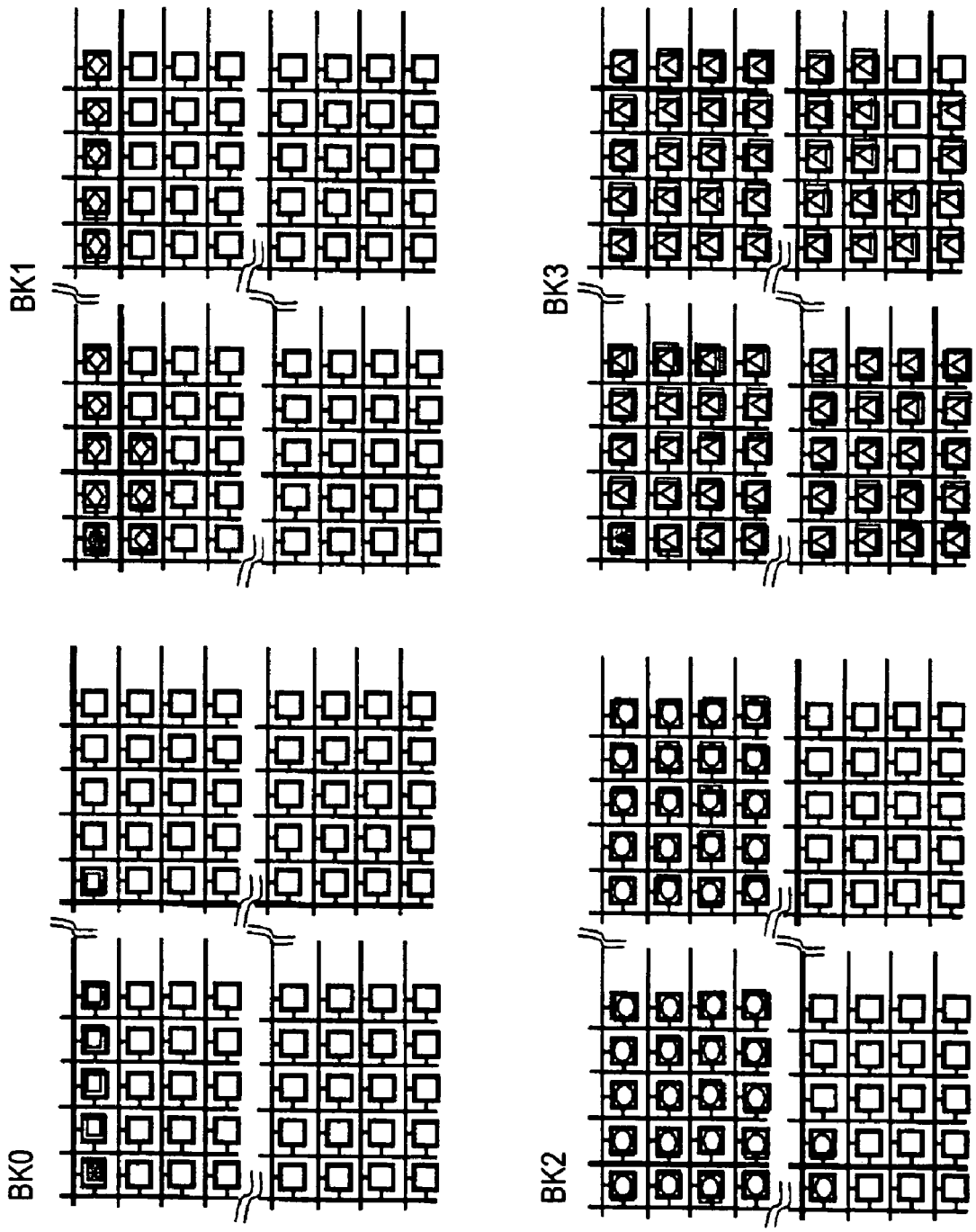
FIG. 8 is a schematic diagram showing data storage in word lines and bit line in the data storage device and an accessing method.
Figure 9:
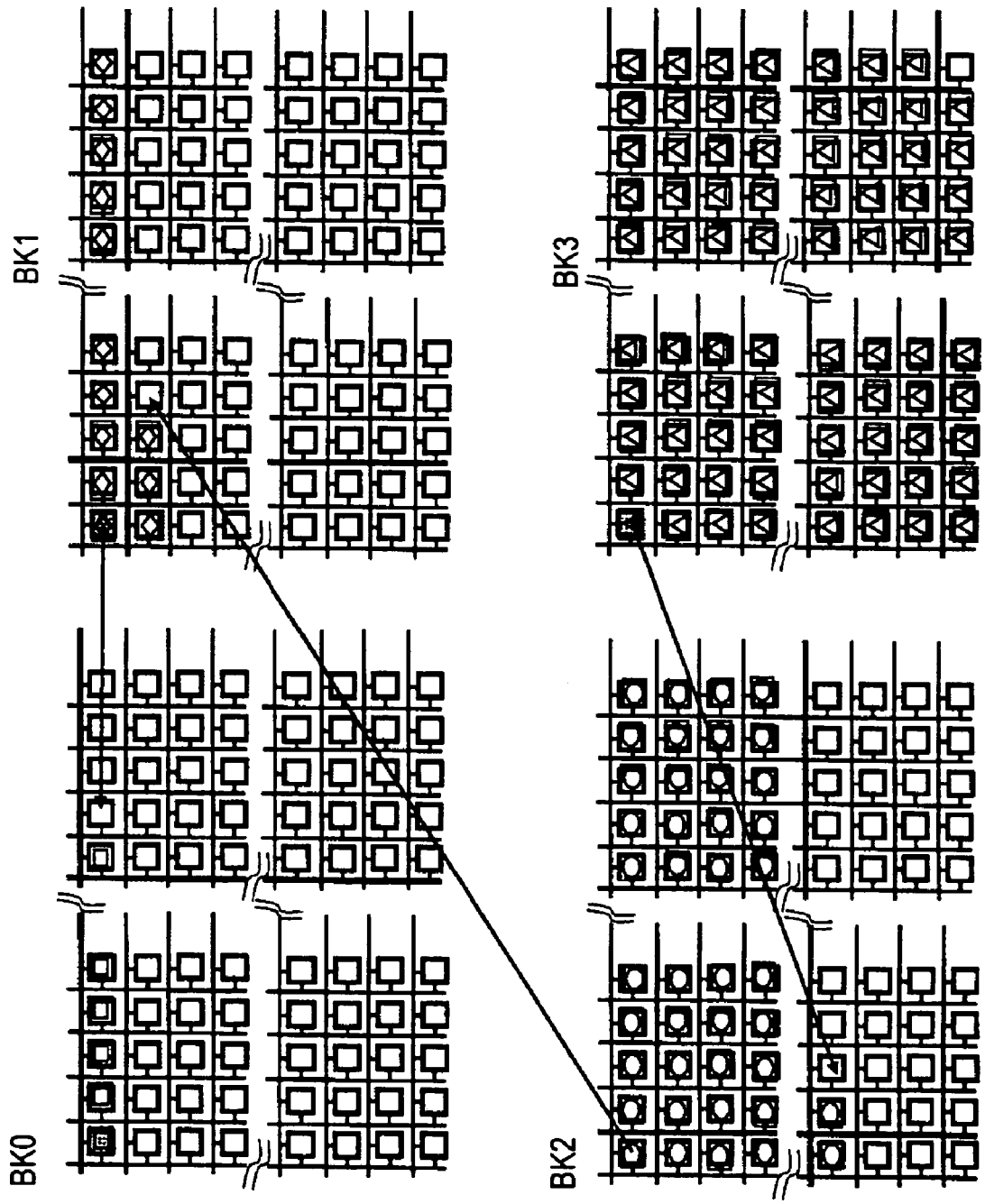
FIG. 9 is a schematic diagram showing rearrangement of data accessed by the data storage device into word lines and bit lines.

In the data storage device 100, in order to access pixels of image data initially arranged into the memory 10 in the manner described above, as shown in FIG. 8, a pixel of image data is read from a given bank address. Then, as shown in FIG. 9, the pixel of image data is stored at a location corresponding to the values of the write word line address and write bit line address of a bank address one bank address prior to this bank address being incremented by +1 so that, as shown in FIGS. 10A to 13B, the pixels become simultaneously accessible if the access pattern is moved in the scanning order.

Figures 10A, 10B:
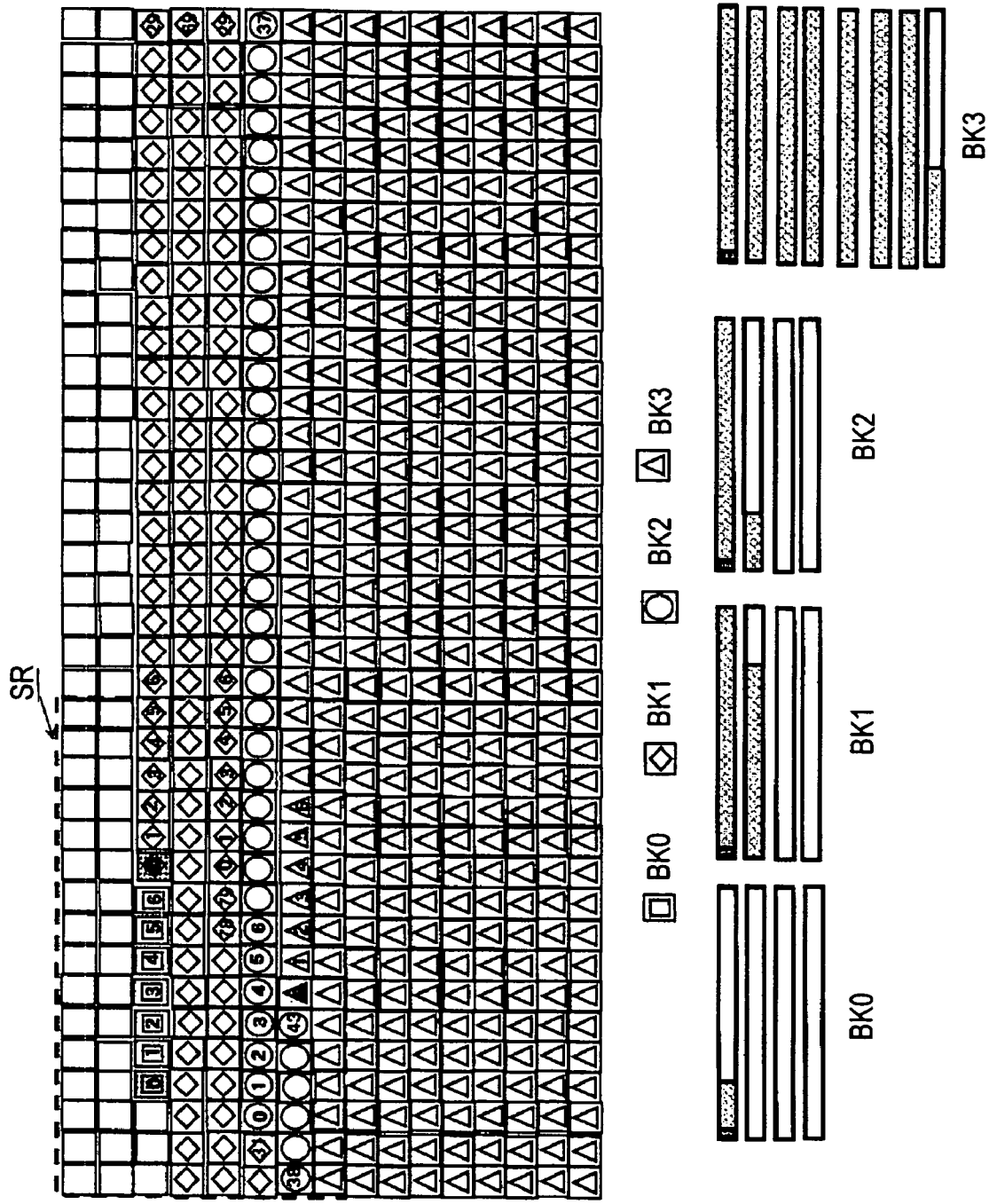
FIGS. 10A and 10B are schematic diagrams showing an operation for simultaneously reading a plurality of pixels of image data by the data storage device.
Figure 11A:
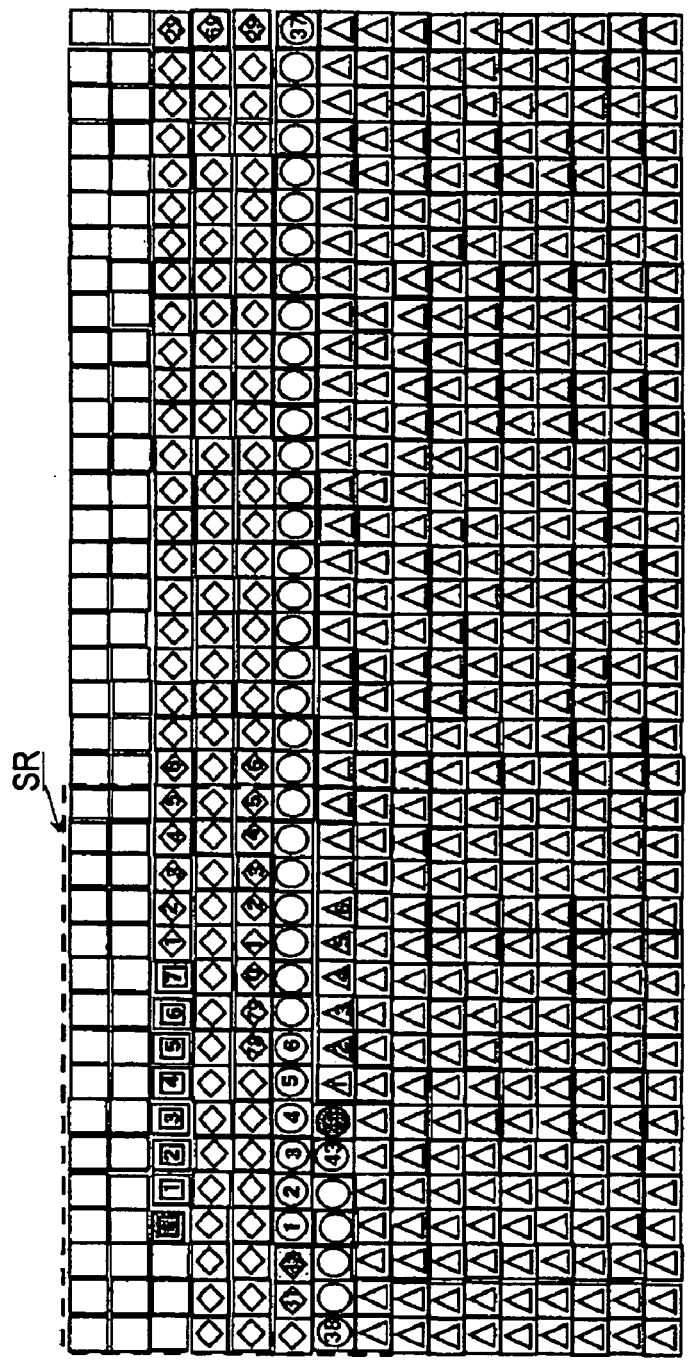
FIGS. 11A and 11B are schematic diagrams showing an operation for rearranging a plurality of read pixels of image data behind a region in a memory bank one memory bank prior to a current memory bank to which pixel data has already been written.
Figure 11B:
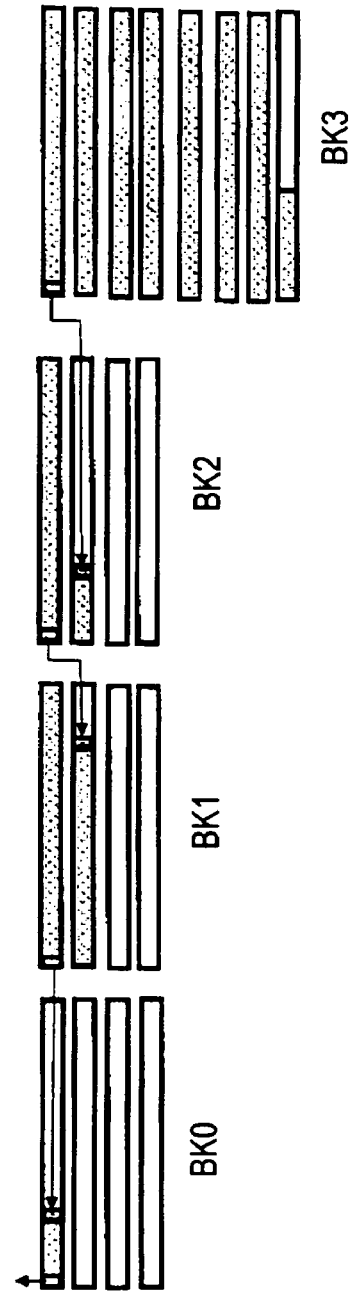
Figure 12A:
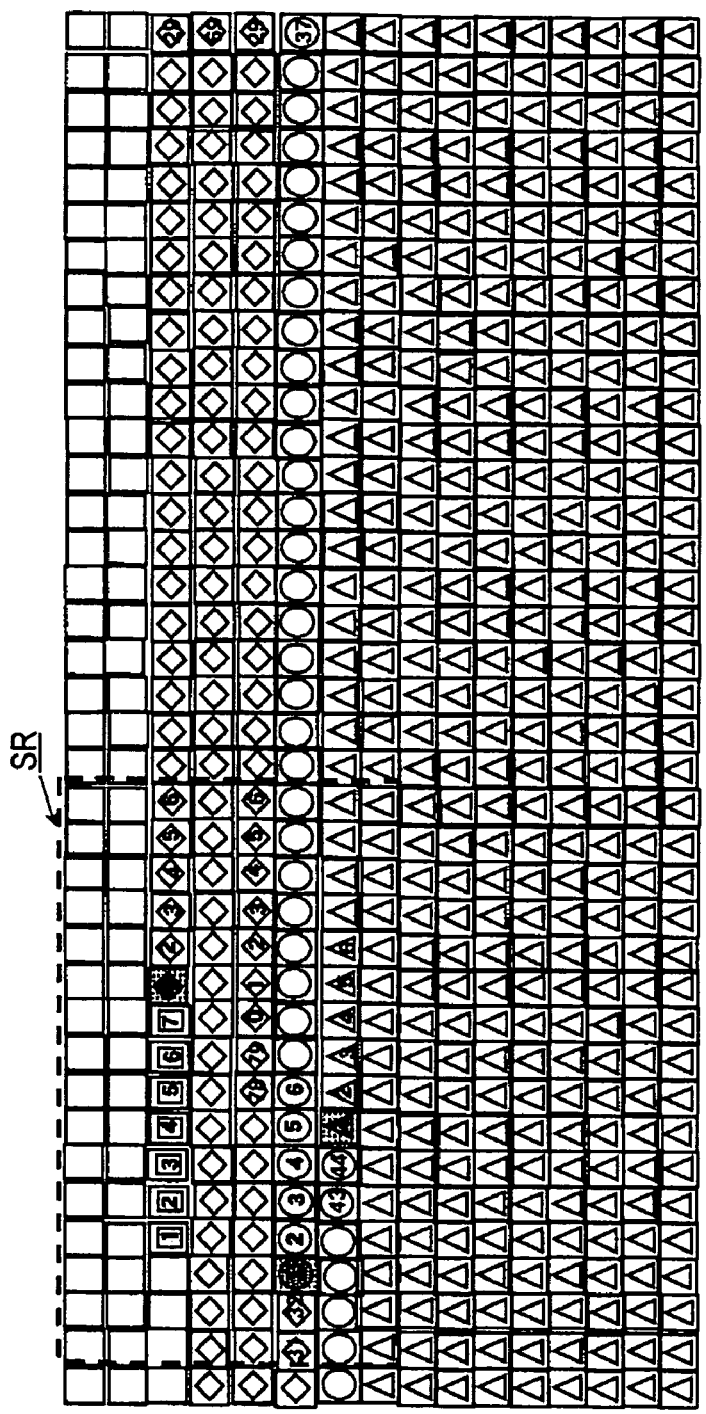
FIGS. 12A and 12B are schematic diagrams showing an operation for simultaneously reading a plurality of pixels of image data by the data storage device when a search region is horizontally changed (moved) by +1 from the initial position.
Figure 12B:
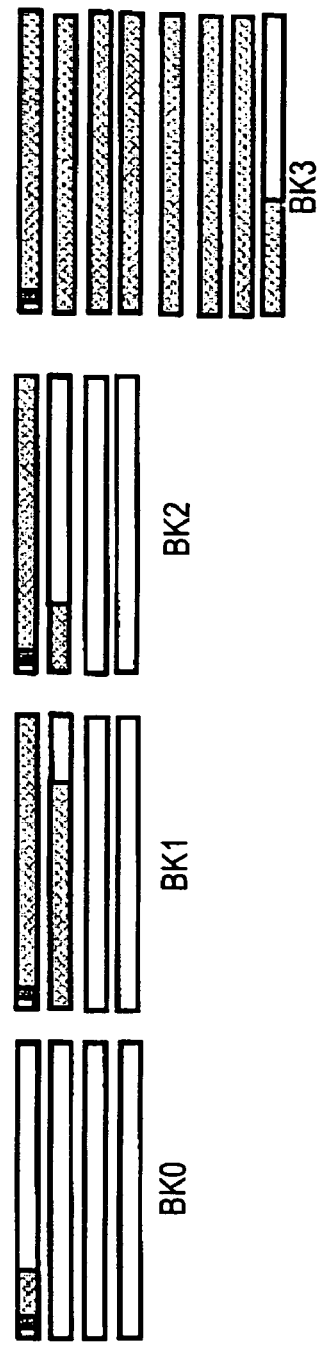
Figure 13A:
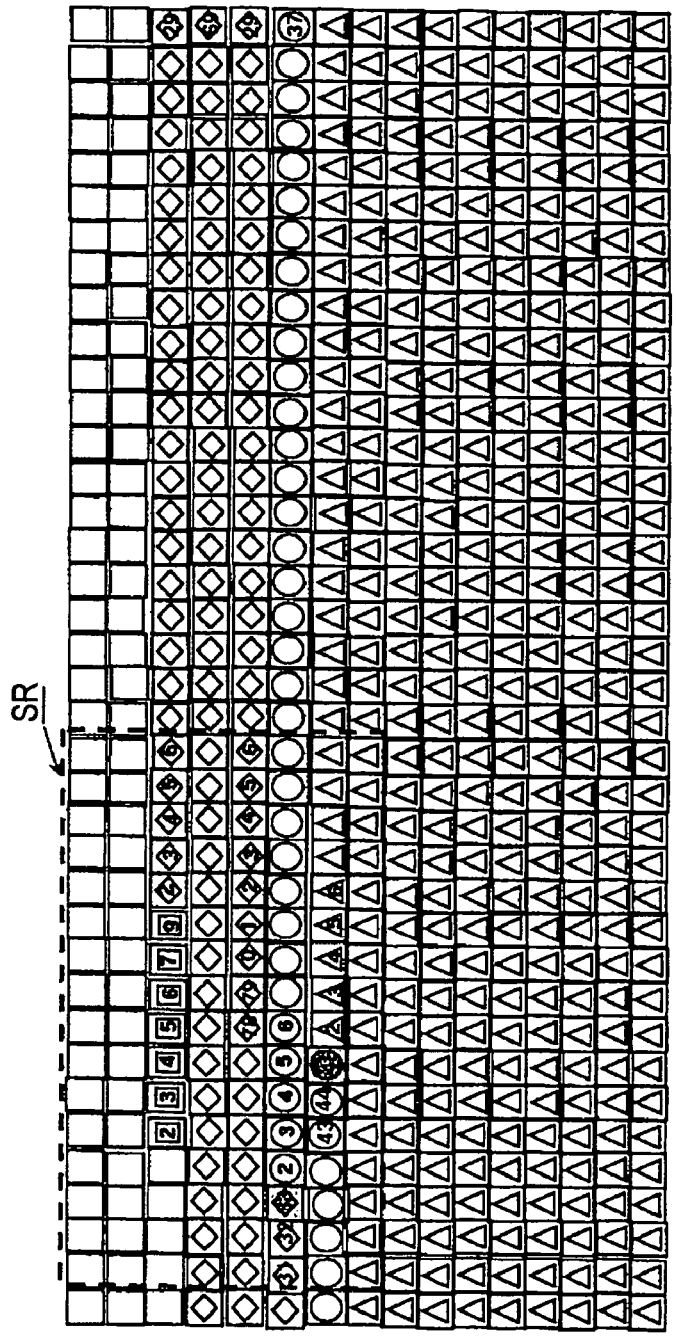
FIGS. 13A and 13B are schematic diagrams showing an operation for rearranging a plurality of read pixels of image data when a search region is horizontally changed (moved) by +1 from the initial position.
Figure 13B:
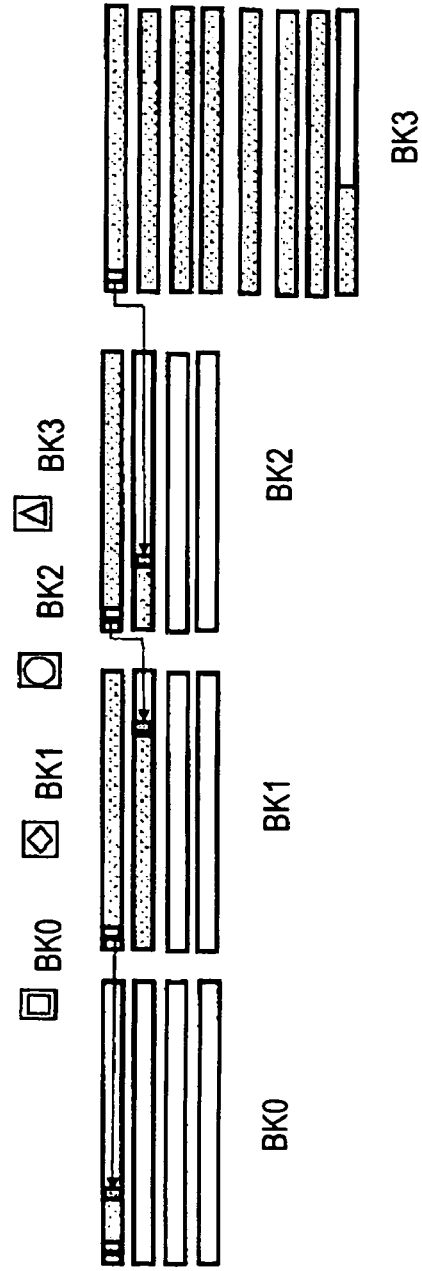

Specifically, as shown in FIGS. 10A and 10B, a pixel of image data is read from a given bank address from pixels of image data initially arranged in the memory 10. Then, as shown in FIGS. 11A and 11B, the pixel of image data is stored at a location corresponding to the values of the write word line address and write bit line address of a bank address one bank address prior to this bank address being incremented by +1. Although pixels are still read from memory banks as the search region SR is moved, memory banks in which the last access candidate pixels are stored are followed by different memory banks, thus allowing the pixels to be simultaneously accessed if the pattern is moved in the scanning order. FIGS. 12A, 12B, 13A, and 13B show data accessing and rearrangement when the search region SR is horizontally changed (moved) by +1 from the initial position.

FIGS. 10A, 11A, 12A, and 13A show a two-dimensional data arrangement, and FIGS. 10B, 11B, 12B, and 13B show a one-dimensional arrangement in the memory banks BK0 to BK3. In FIGS. 10A, 11A, 12A, and 13A, a number represents a bit line address number in a memory bank in which a pixel is stored.

In the data storage device 100, the data read/storage controller 30 reads pixels on a word line address and a bit line address in memory banks while incrementing the word line address counters 31-0 to 31-3 and the bit line address counters 32-0 to 32-3, thereby reading the desired pixels. When a predetermined number of word line addresses and bit line addresses are exhausted, these addresses are reset to zero.

In this way, a pixel with the first memory bank number is written to the last memory bank. Alternatively, a pixel to be needed for later processing is written to a memory used for the later processing. In any case, this pixel is no longer necessary in the current processing.

Figure 14:
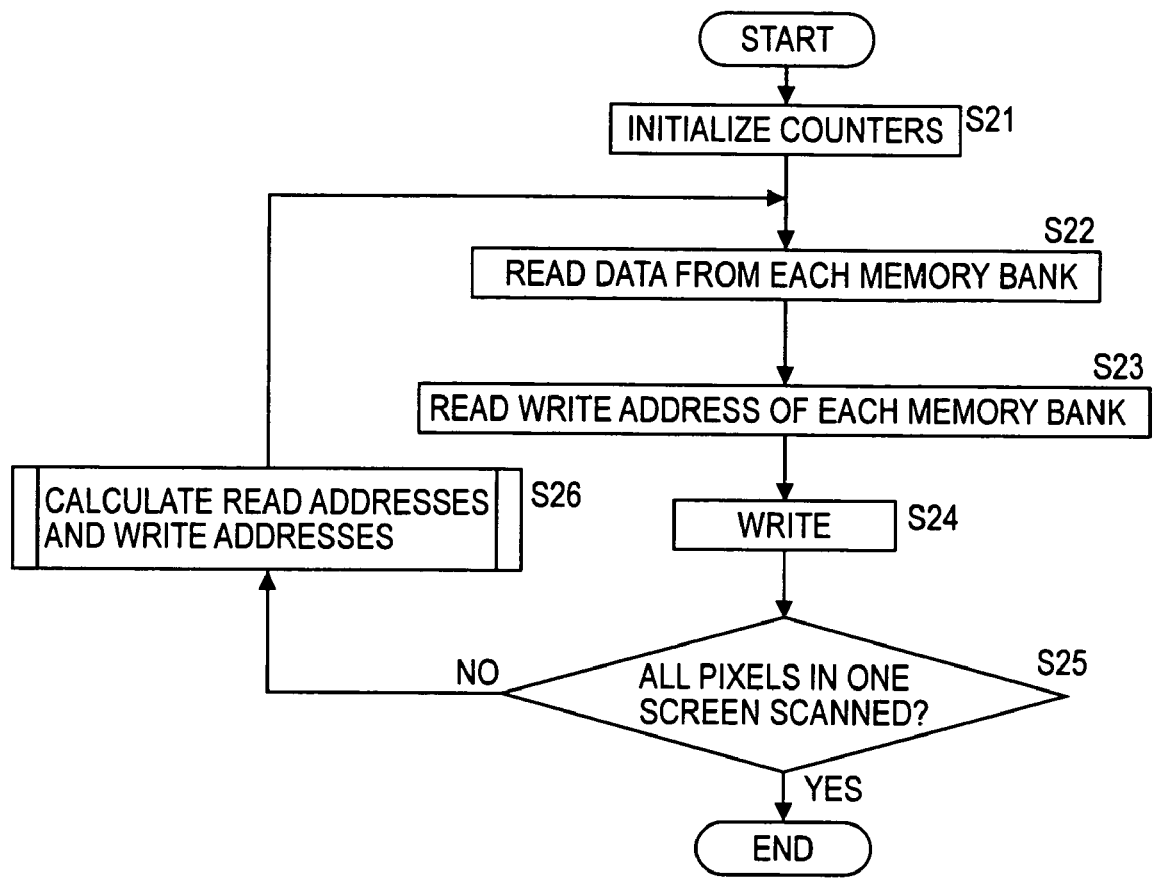
FIG. 14 is a flowchart showing an accessing process performed by the data read/storage controller.

In the data storage device 100, the data read/storage controller 30 is configured by, for example, a microprocessor, and performs an access process according to a data storage control program stored in a program memory (not shown) taken with reference to a flowchart shown in FIG. 14.

When the access process starts, as initial setting, first, the data read/storage controller 30 initializes the bit line address counters 31-0 to 31-3 for reading data (hereinafter referred to as a "read bit line address counter 31") and the word line address counters 32-0 to 32-3 for reading data (hereinafter referred to as a "read word line address counter 32") to zero (step S21).

Then, pixels of image data constituting an access pattern AP are read from the memory 10 using read addresses of memory banks that are defined by the current values of the read bit line address counters 31 and the read word line address counters 32 (step S22). The write word line addresses and write bit line addresses of the memory banks are read from, for example, the memory 10 (step S23). The pixel read from each memory bank is stored at the write word line address and write bit line address of a memory bank one memory bank prior to each memory bank from which the pixel is read, and the write word line address and the write bit line address are also stored (step S24).

Then, it is determined whether or not all pixels of one screen have been scanned based on the number of read pixels (step S25).

If all pixels of one screen have not been scanned (No in step S25), then in step S26, the read word line address and bit line address of the bank address, which are necessary for subsequent reading from each memory bank, and the write word line address and bit line address of the bank address, which are necessary for writing to each memory bank, are calculated and are stored in, for example, the memory 10. Then, the processing from step S22 is repeatedly performed. When all pixels of one screen have been scanned (Yes in step S25), the accessing process ends.

Figure 15:
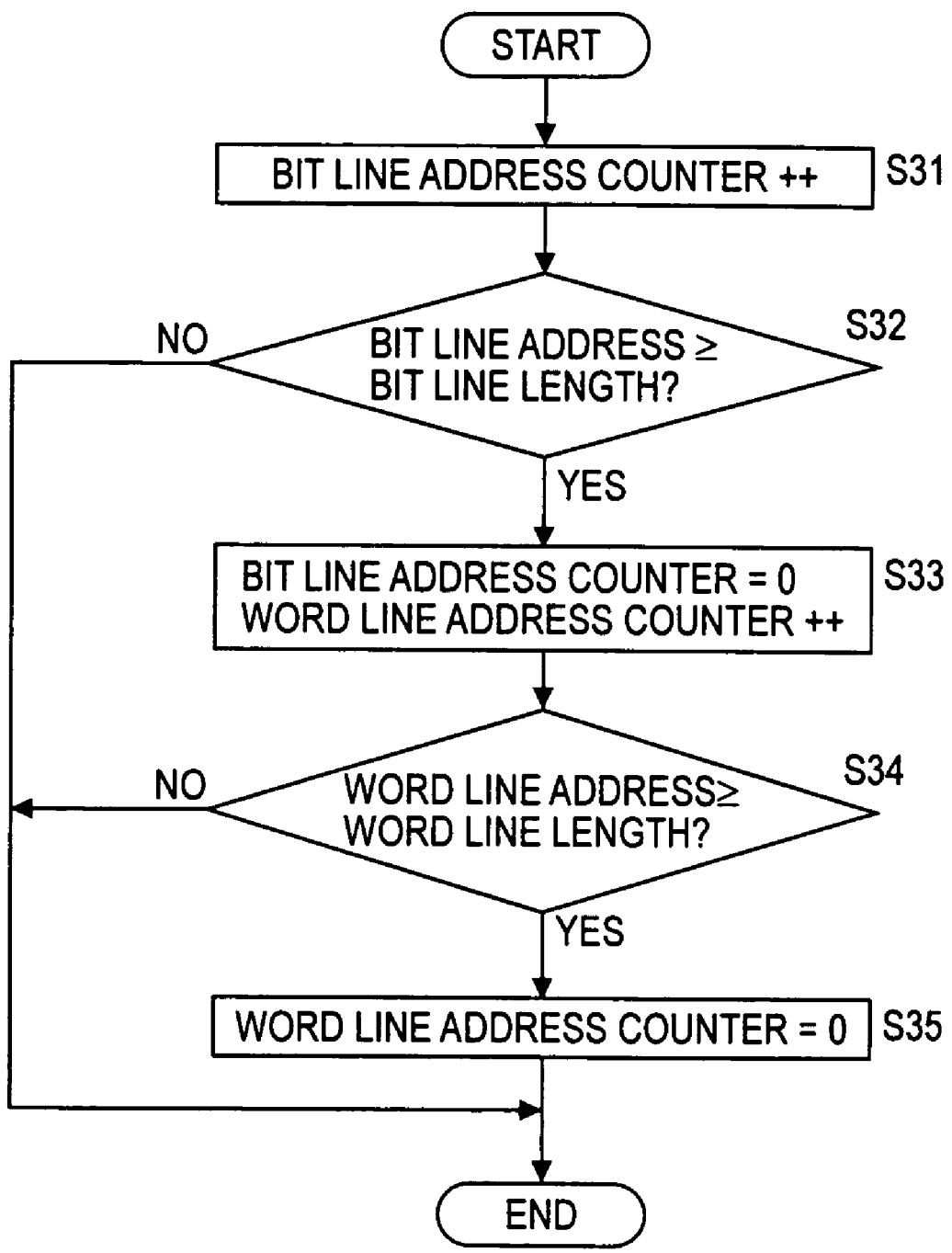
FIG. 15 is a flowchart showing a process for calculating word line addresses and bit line addresses in the accessing process.

The calculation of the word line addresses and the bit line addresses in S26 will now be described with reference to a flowchart shown in FIG. 15.

In step S31, the write bit line address that is last written to each memory bank in step S24 is incremented by the bit line address counter 33.

In step S32, it is determined whether or not the value of the bit line address counter 33 is greater than the bit line length.

If it is determined that the value of the bit line address counter 33 is equal to or greater than the bit line length (Yes in step S32), the bit line address counter 33 is reset to zero, and the write word line address that is last written to each memory bank in step S24 is incremented by the word line address counter 34 (step S33). In step S34, it is determined whether or not the value of the word line address counter 34 is greater than the word line length.

If it is determined that the value of the word line address counter 34 is equal to or greater than the word line length (Yes in step S34), the word line address counter 34 is reset to zero (step S35). Then, the process ends.

If it is determined that the value of the bit line address counter 33 is smaller than the bit line length (No in step S32) or that the value of the word line address counter 34 is smaller than the word line length (No in step S34), the process ends.

The calculation of the read word line address and the read bit line address is performed in a similar manner. In this case, however, the write bit line address counter 33 (i.e., 33-0 to 33-3) and the write word line address counter 34 (i.e., 34-0 to 34-3), which are used for calculation of the write addresses, are replaced by the read bit line address counter 31 and the read word line address counter 32, respectively.

In the calculation of the write addresses, the write bit line address that is last written to each memory bank in step S24 is used in step S31, and the write word line address that is last written to each memory bank that is read in step S23 is used in step S33. In the calculation of the read addresses, on the contrary, the read bit line address that is last read from each memory bank in step S22 is used in step S31, and the read word line address that is last read from each memory bank in step S22 is used in step S33.

In the embodiment described above, when a region between candidates of an access pattern is scanned in the raster direction, the data stored in the memory bank BK3 is written to the memory bank BK2, the data stored in the memory bank BK2 is written to the memory bank BK1, and the data stored in the memory bank BK1 is written to the memory bank BK0. However, this is merely an example, and data may be read and written according to a certain pattern. For example, the data stored in the memory bank BK3 may be written to the memory bank BK0, the data stored in the memory bank BK0 may be written to the memory bank BK2, and the data stored in the memory bank BK2 may be written to the memory bank BK1. The pixels may be scanned not only in the raster direction but also in the direction opposite to the raster direction, the vertical direction, the diagonal direction, or the like.

In the embodiment described above, the data read/storage controller 30 reads pixels of data on a word line address and a bit line address in memory banks while incrementing the word line address and the bit line address. However, the present invention is not limited to this form, and data may be read according to a certain pattern. The pixels on the word line address and the bit line address may be read based on a predetermined pattern while decrementing the word line address and the bit line address.

In the embodiment described above, pixel data read from a given memory bank is stored behind a region in the previous memory bank to which pixel data has already been written. Alternatively, the pixel data may be overwritten to a region in the previous memory bank from which pixel data has already been read. That is, pixel data may be overwritten from the beginning of the previous memory bank. In this case, like storage behind a region to which pixel data has been written, it is necessary to sequentially overwrite an address following the address overwritten. As described above, pixel data may be written to a memory bank other than the previous memory bank.

Figure 16A:
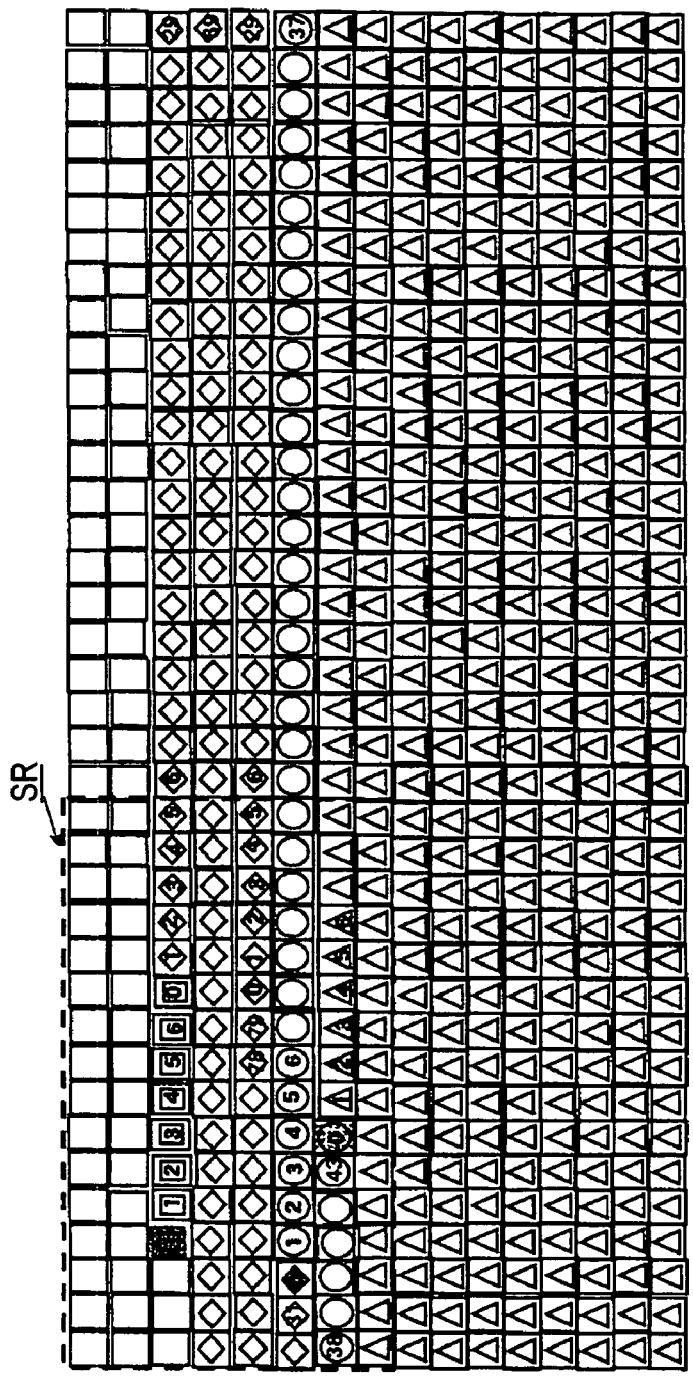
FIGS. 16A and 16B are schematic diagrams showing an operation for rearranging a plurality of pixels of image data read by the data storage device by overwriting these pixels of image data in a region of a memory bank one memory band prior to a current memory bank from which data has already been read.
Figure 16B:
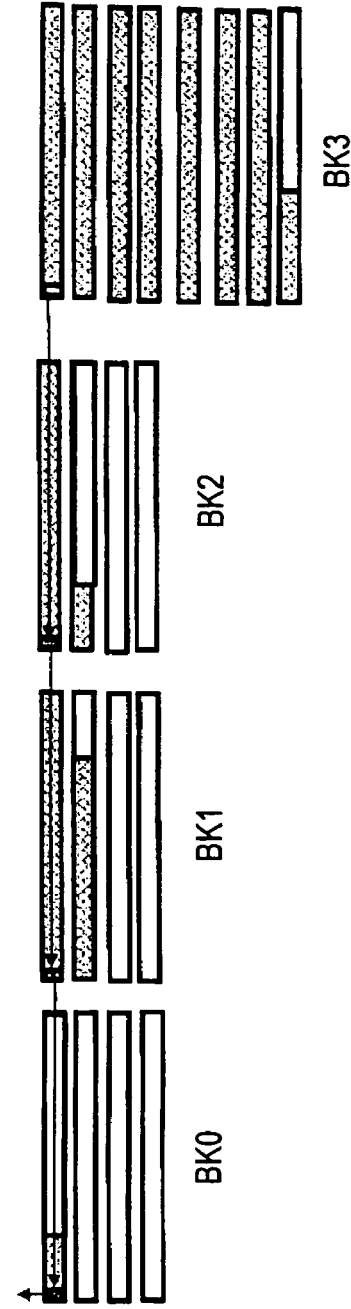

As described above, as shown in FIGS. 10A and 10B, a pixel of image data in the pixels of image data initially arranged in the memory 10 is read from a given bank address. Then, as shown in FIGS. 16A and 16B, the pixel of image data is stored at the write word line address and write bit line address of a bank address one bank address prior to this bank address. Although pixels are still read from banks as the search region SR is changed (moved), memory banks to which accessed pixels are to be written are sequentially selected, thus allowing the pixels to be simultaneously accessed if the pattern is moved in the scanning order. FIGS. 17A, 17B, 18A, and 18B show data accessing and rearrangement when the search region SR is horizontally changed (moved) by +1 from the initial position.

Figure 17A:
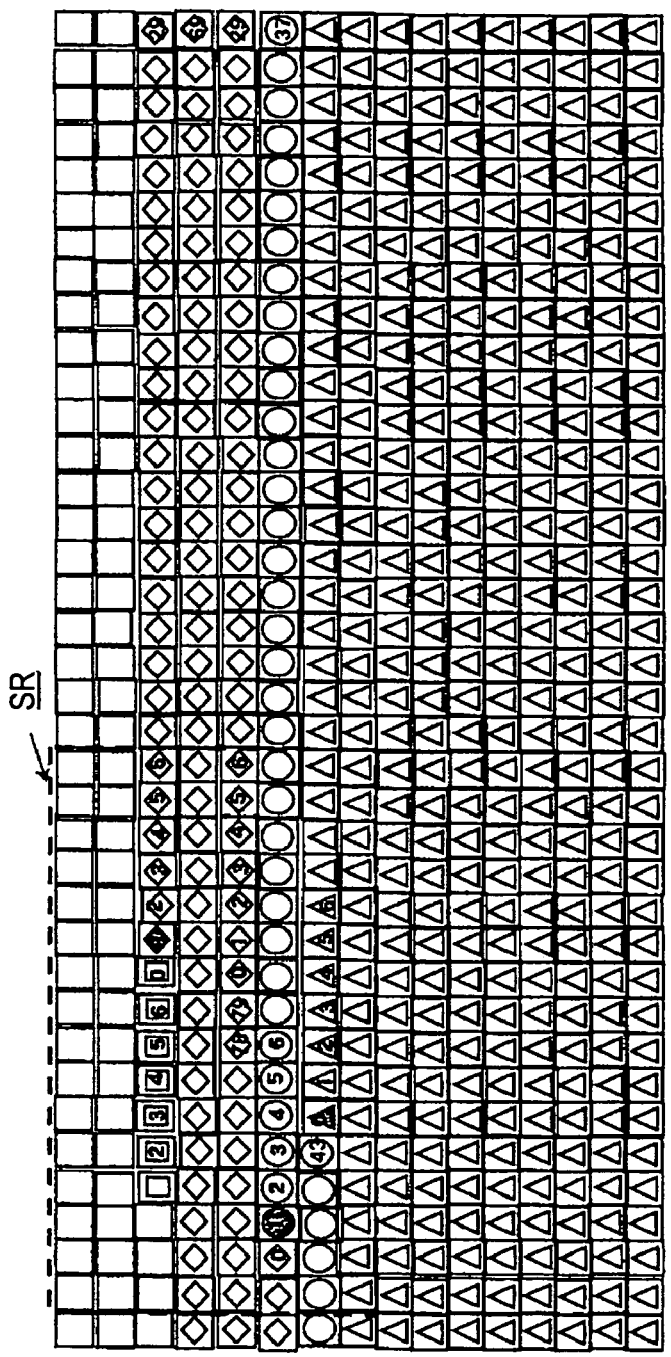
FIGS. 17A and 17B are schematic diagrams showing an operation for simultaneously reading a plurality of pixels of image data by the data storage device when a search region is horizontally changed (moved) by +1 from the initial position.
Figure 17B:
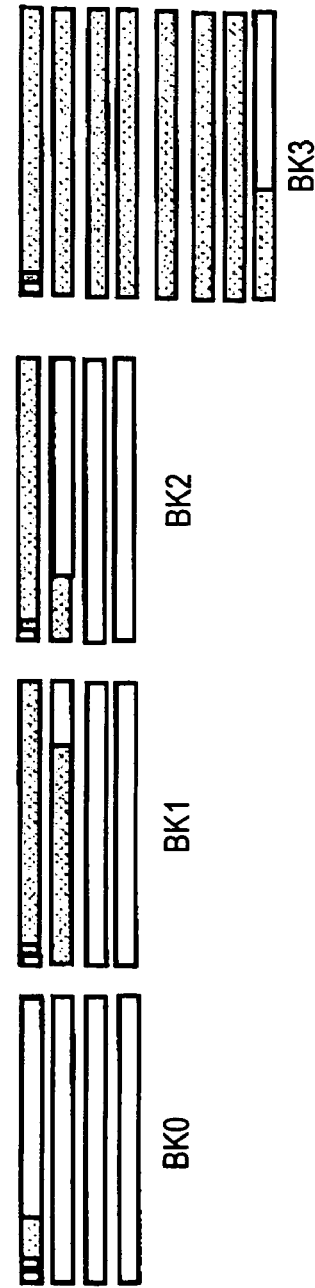
Figure 18A:
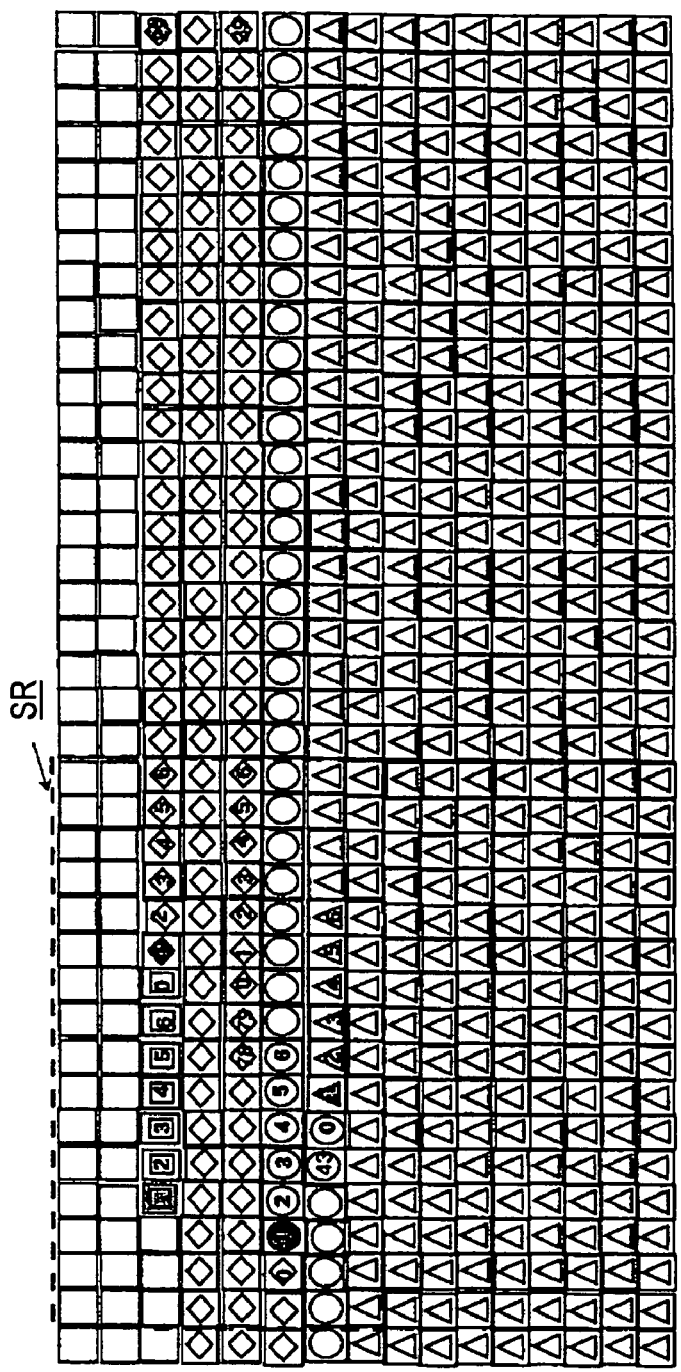
FIGS. 18A and 18B are schematic diagrams showing an operation rearranging a plurality of read pixels of image data when a search region is horizontally changed (moved) by +1 from the initial position.
Figure 18B:
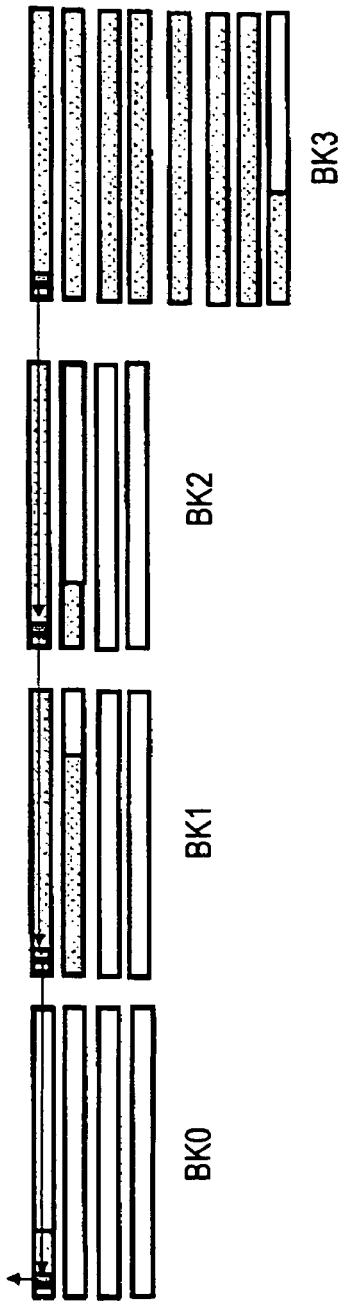
Figure 19:
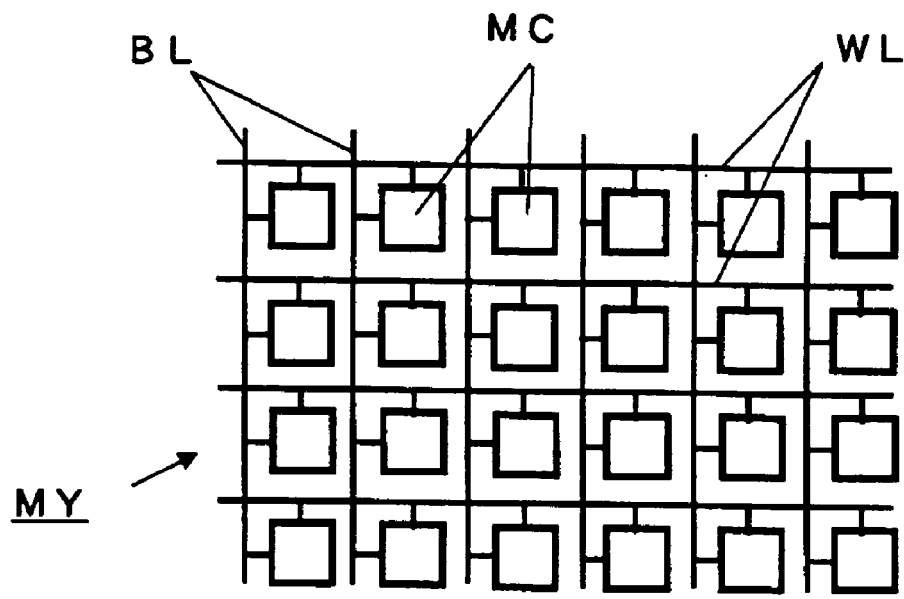
FIG. 19 is a schematic diagram of a typical semiconductor memory.
Figure 20:
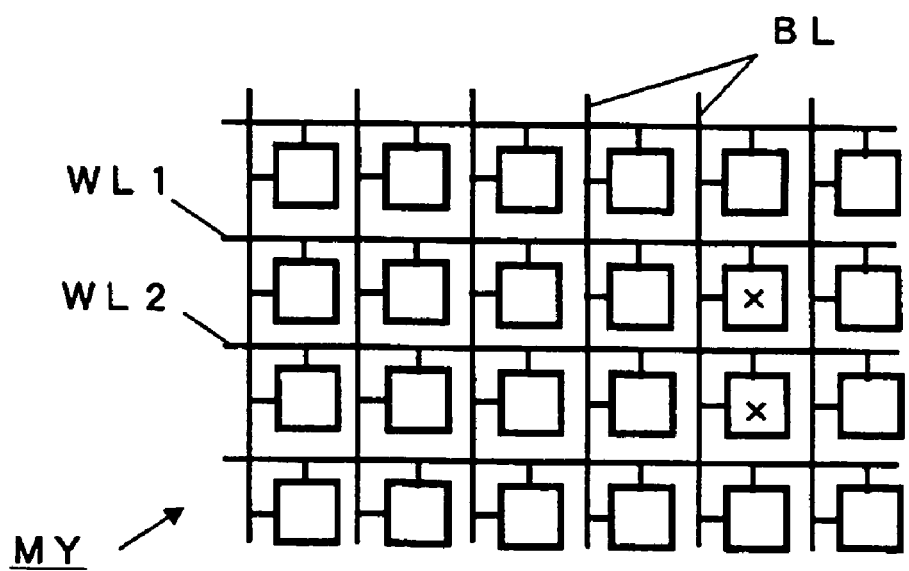
FIG. 20 is a schematic diagram of the semiconductor memory, showing that pixels are not simultaneously accessible.
Figure 21:
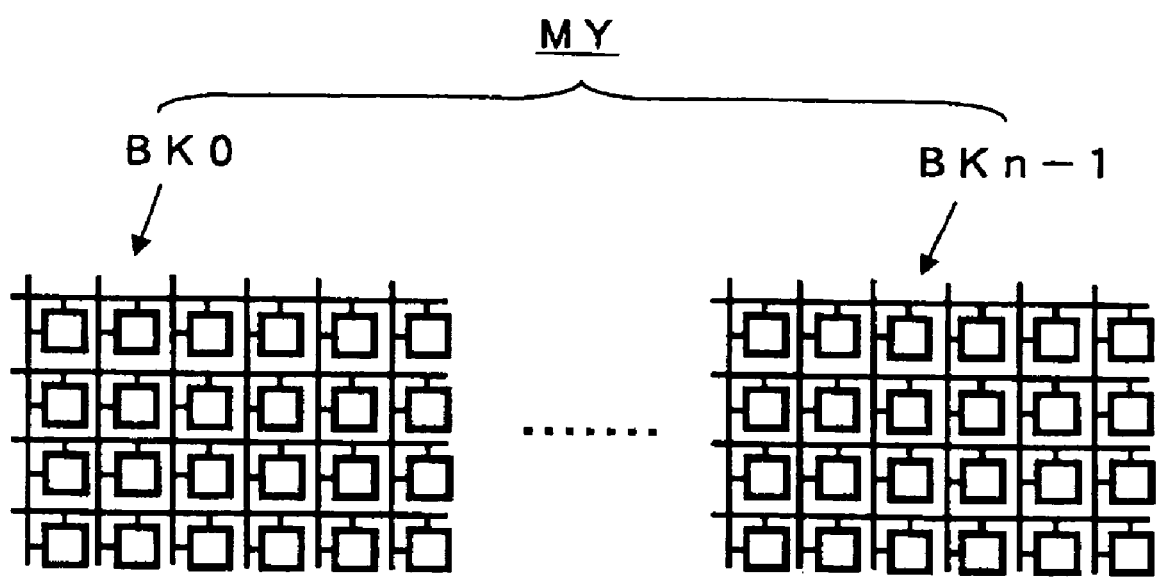
FIG. 21 is a memory configuration diagram of a plurality of memory banks.
Figure 22A:
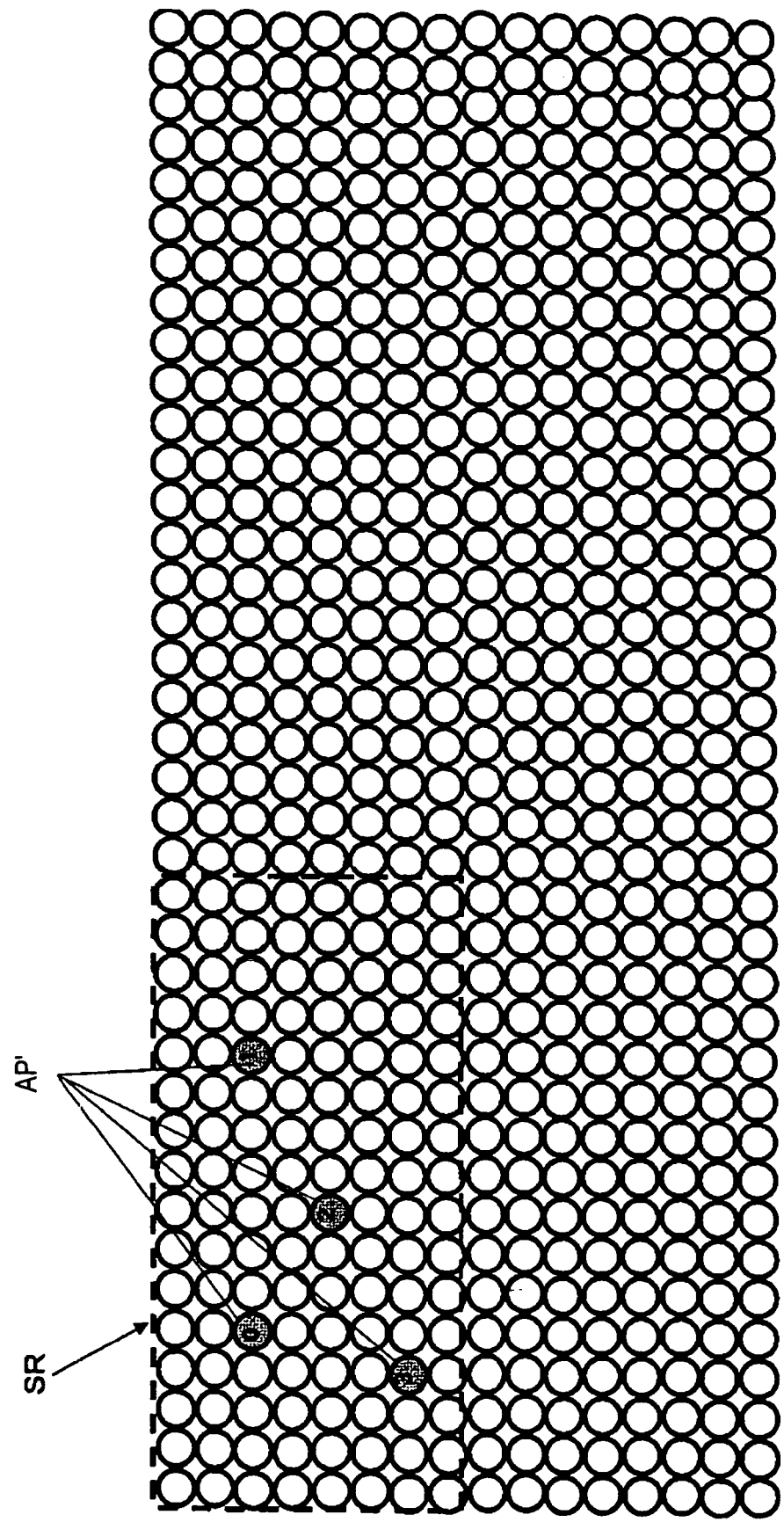
FIGS. 22A and 22B are schematic diagrams showing an image having a pattern of four pixels to be accessed simultaneously, the four pixels being stored in different memory banks.
Figure 22B:
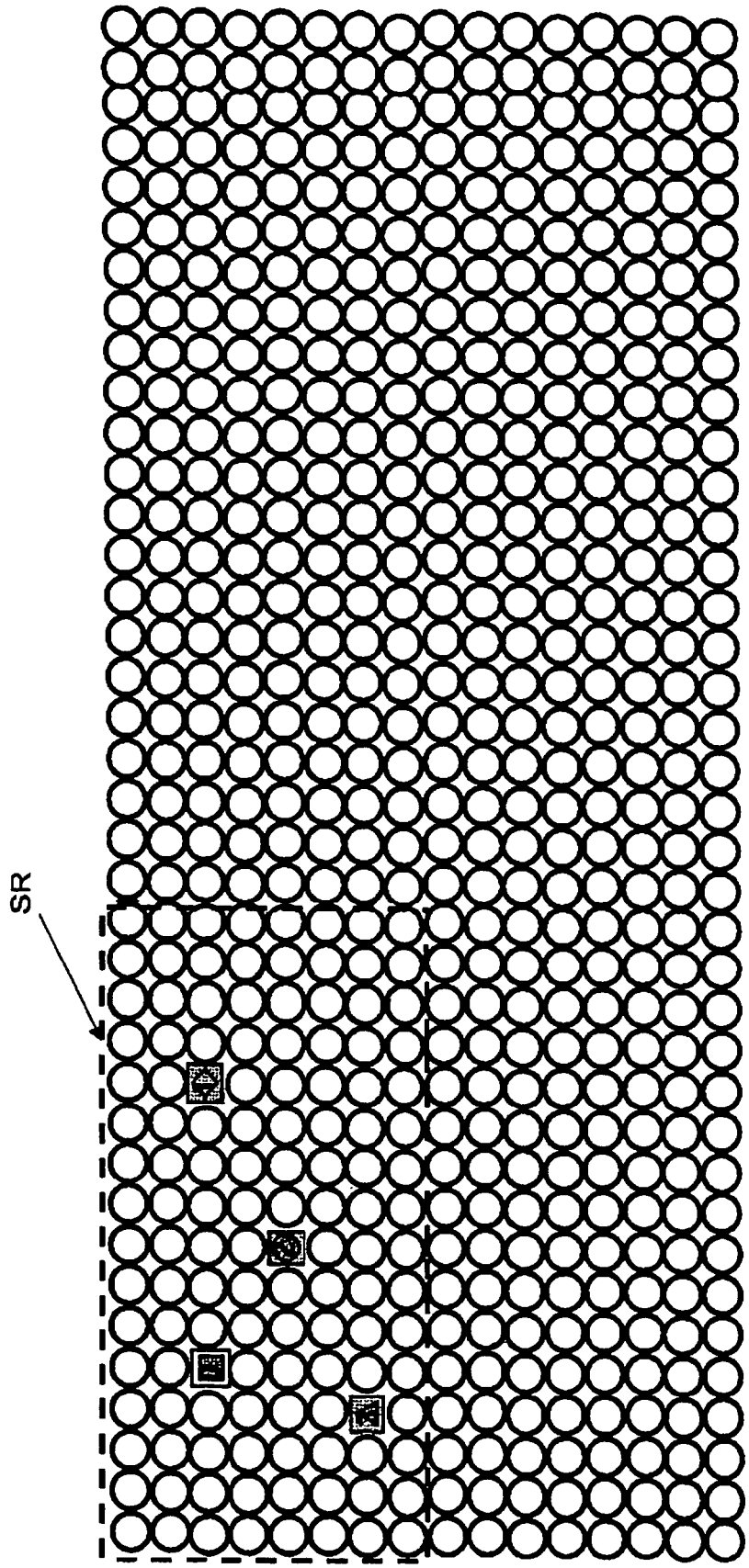
Figure 23:
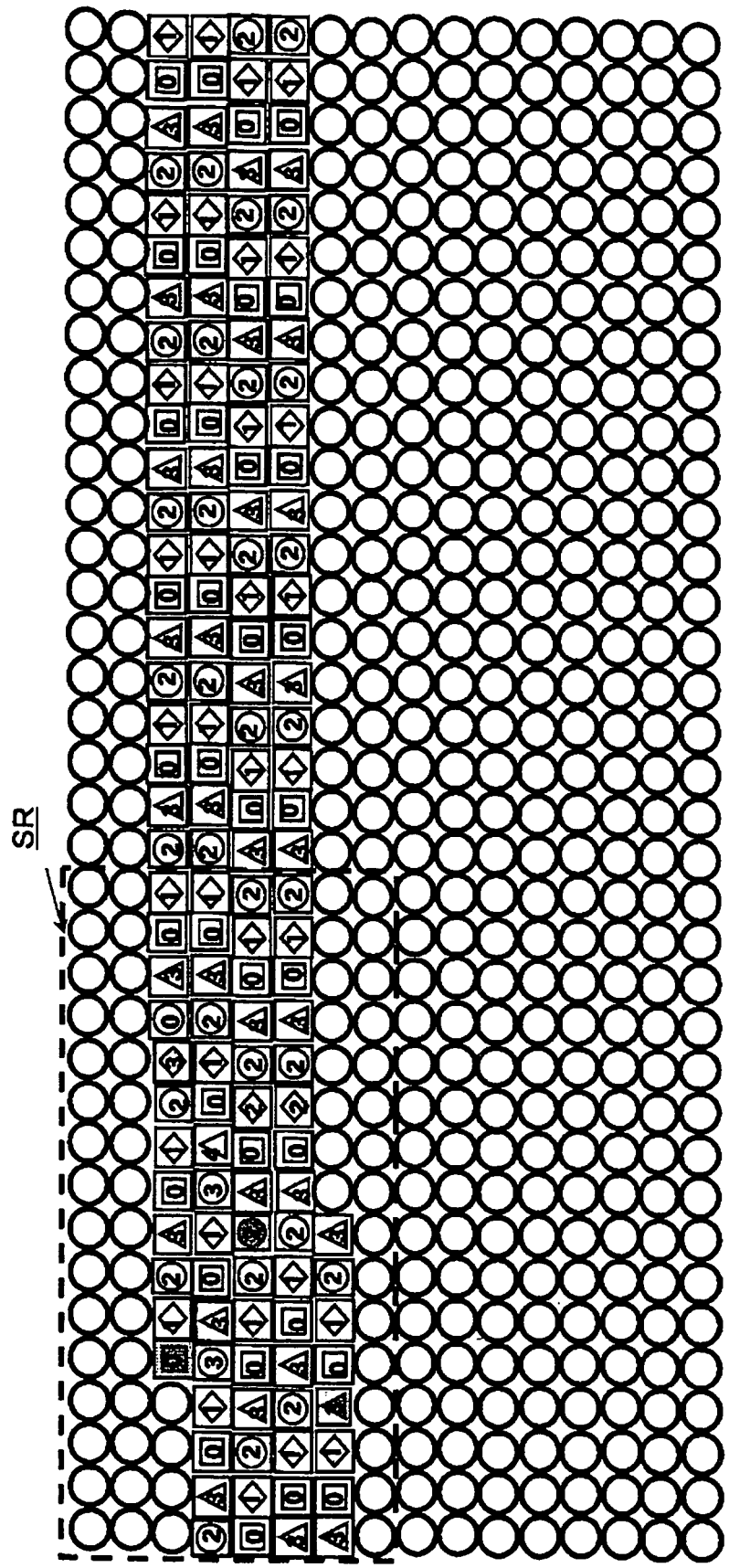
FIG. 23 is a schematic diagram showing that pixels between access candidates are stored in different memory banks one-by-one.
Figure 24:
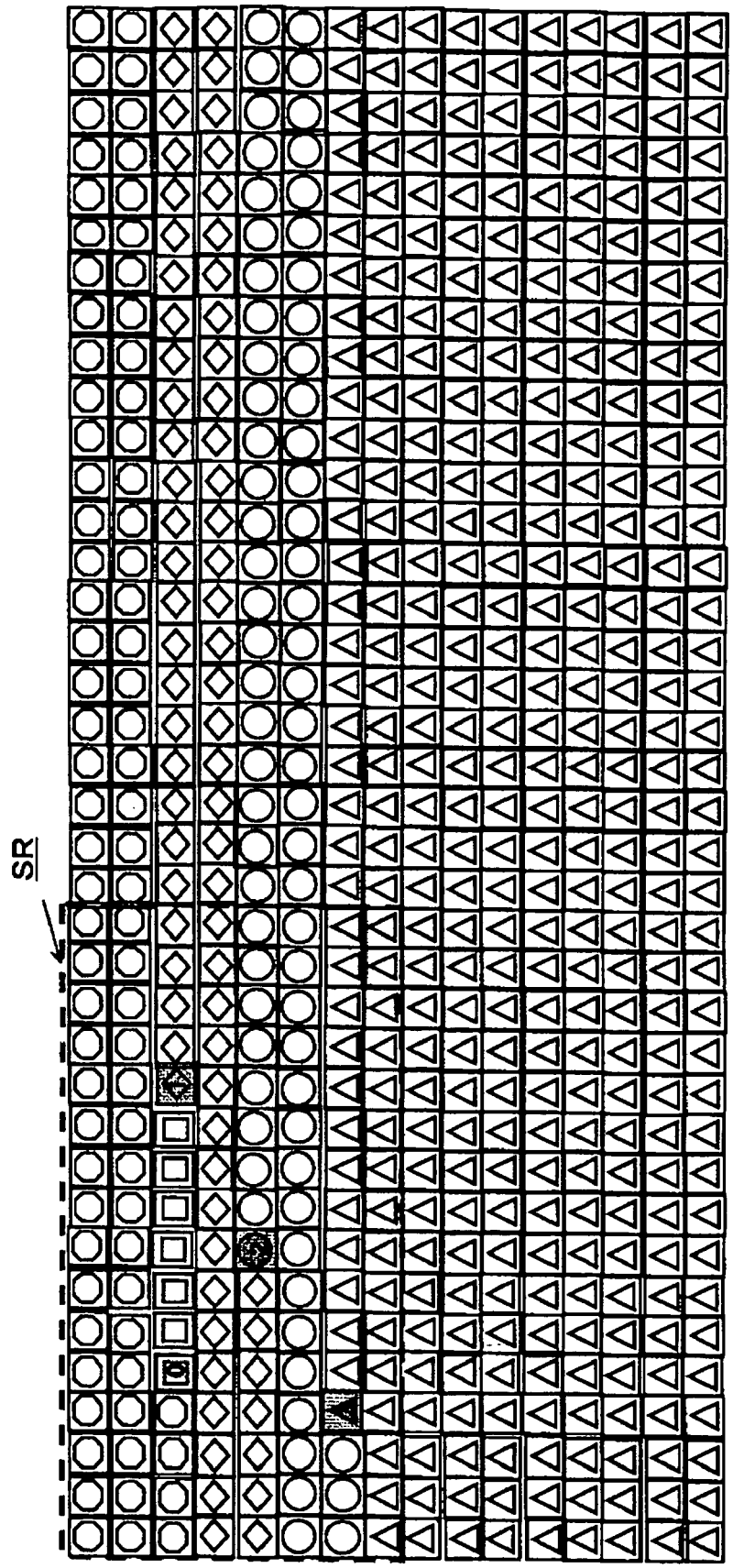
FIG. 24 is a schematic diagram showing that pixels between access candidates are stored in the same memory bank.
Figure 25A:
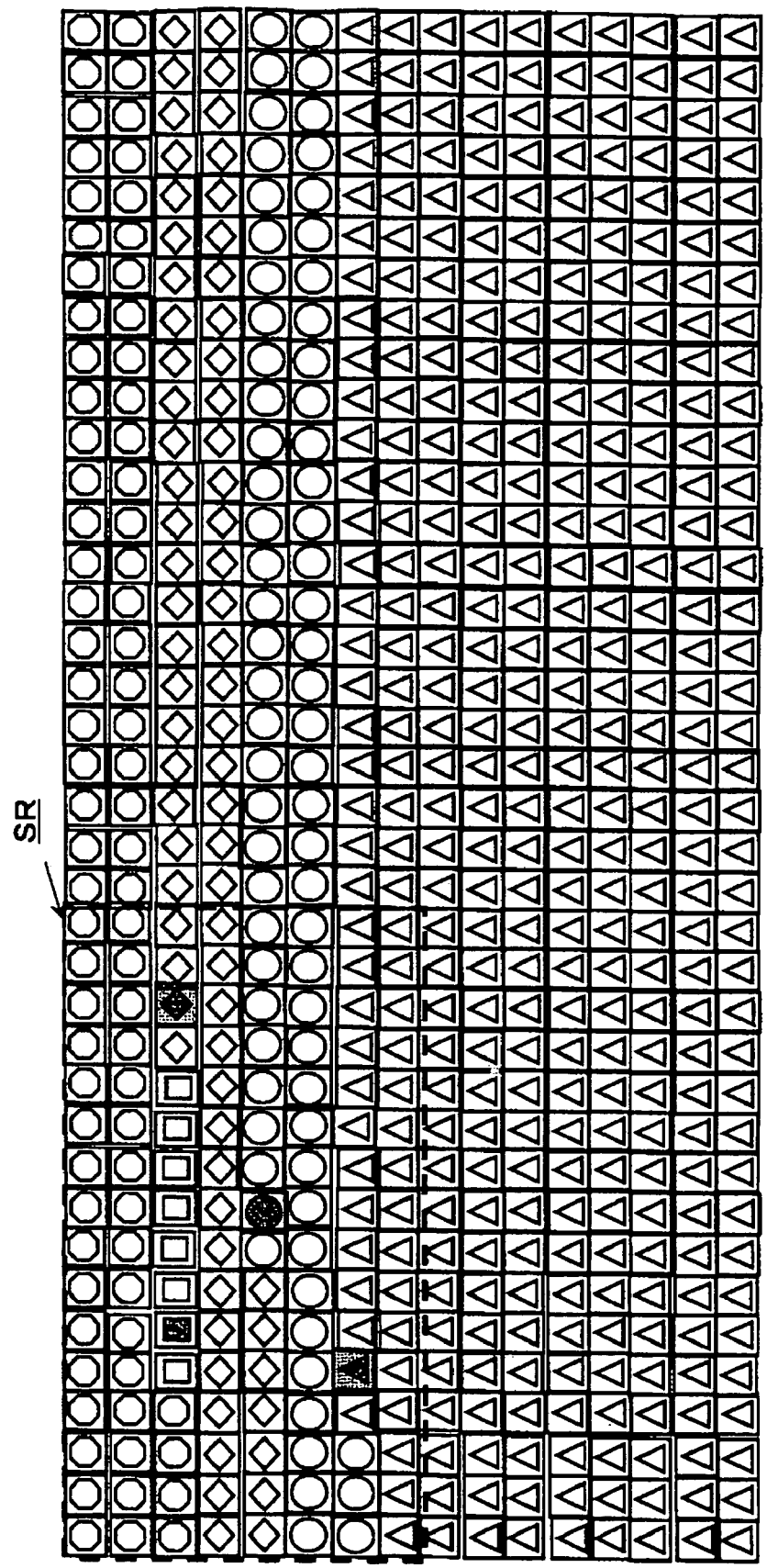
FIGS. 25A, 25B, and 25C are schematic diagrams showing that when pixels between access candidates are stored in the same memory bank, pixels are simultaneously accessible to some extent if an access pattern is moved in the scanning order.
Figure 25B:
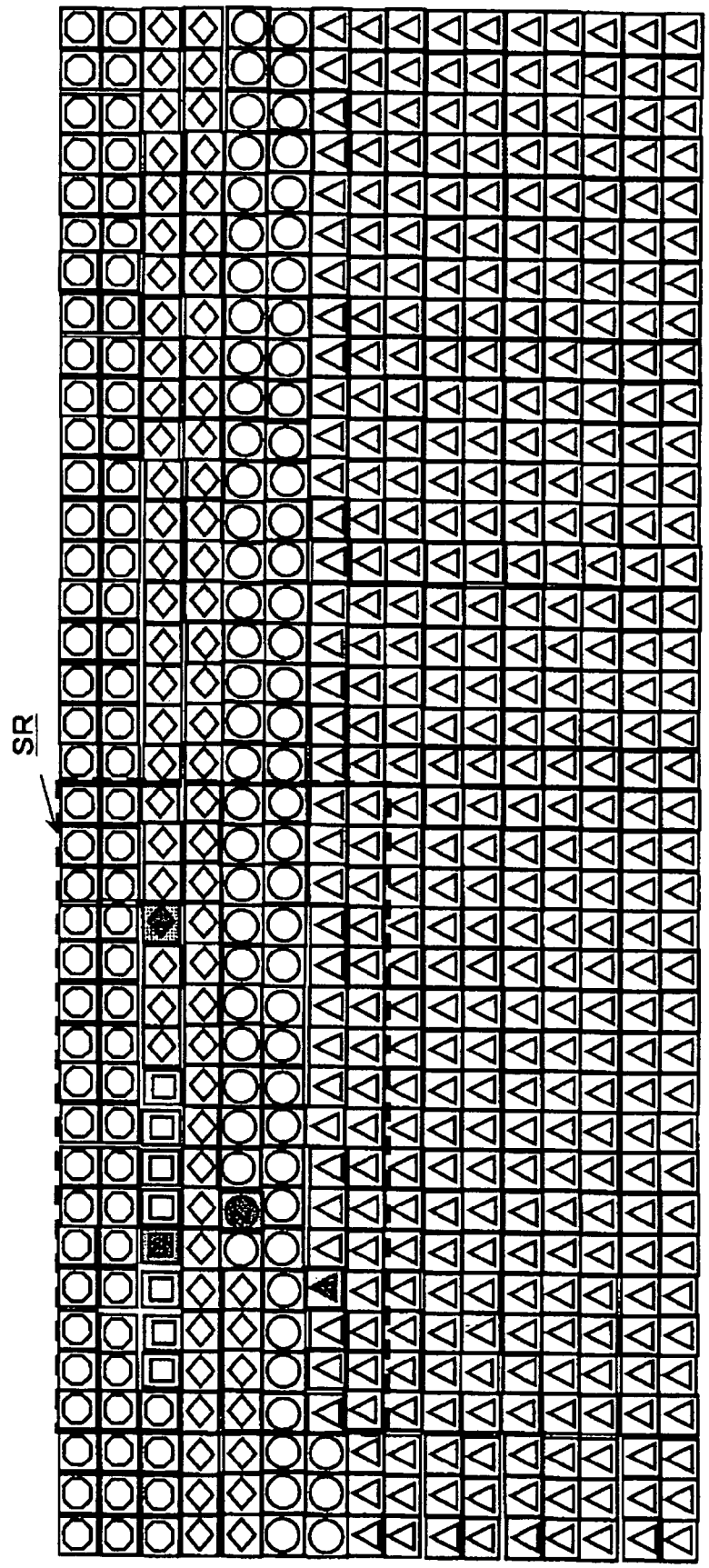
Figure 25C:
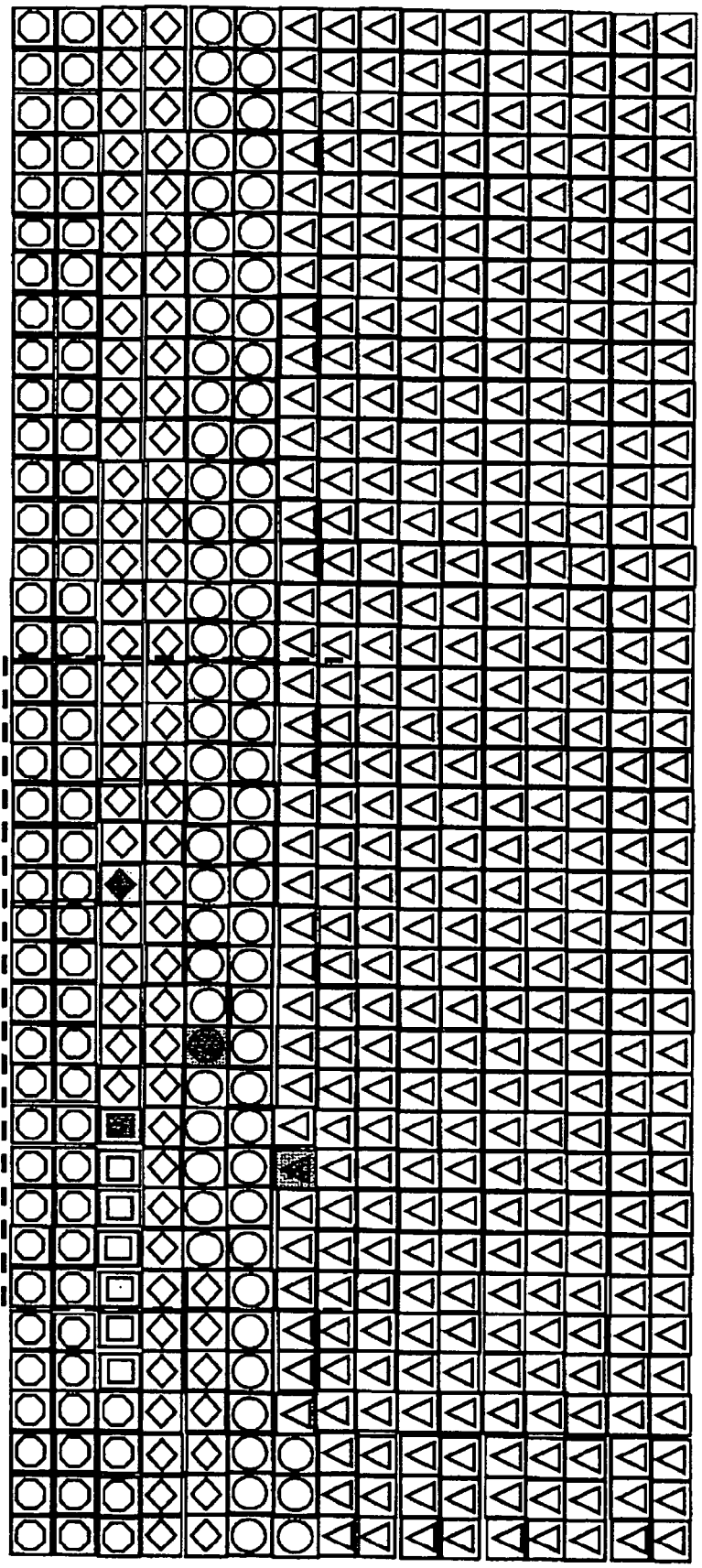
Figure 26:
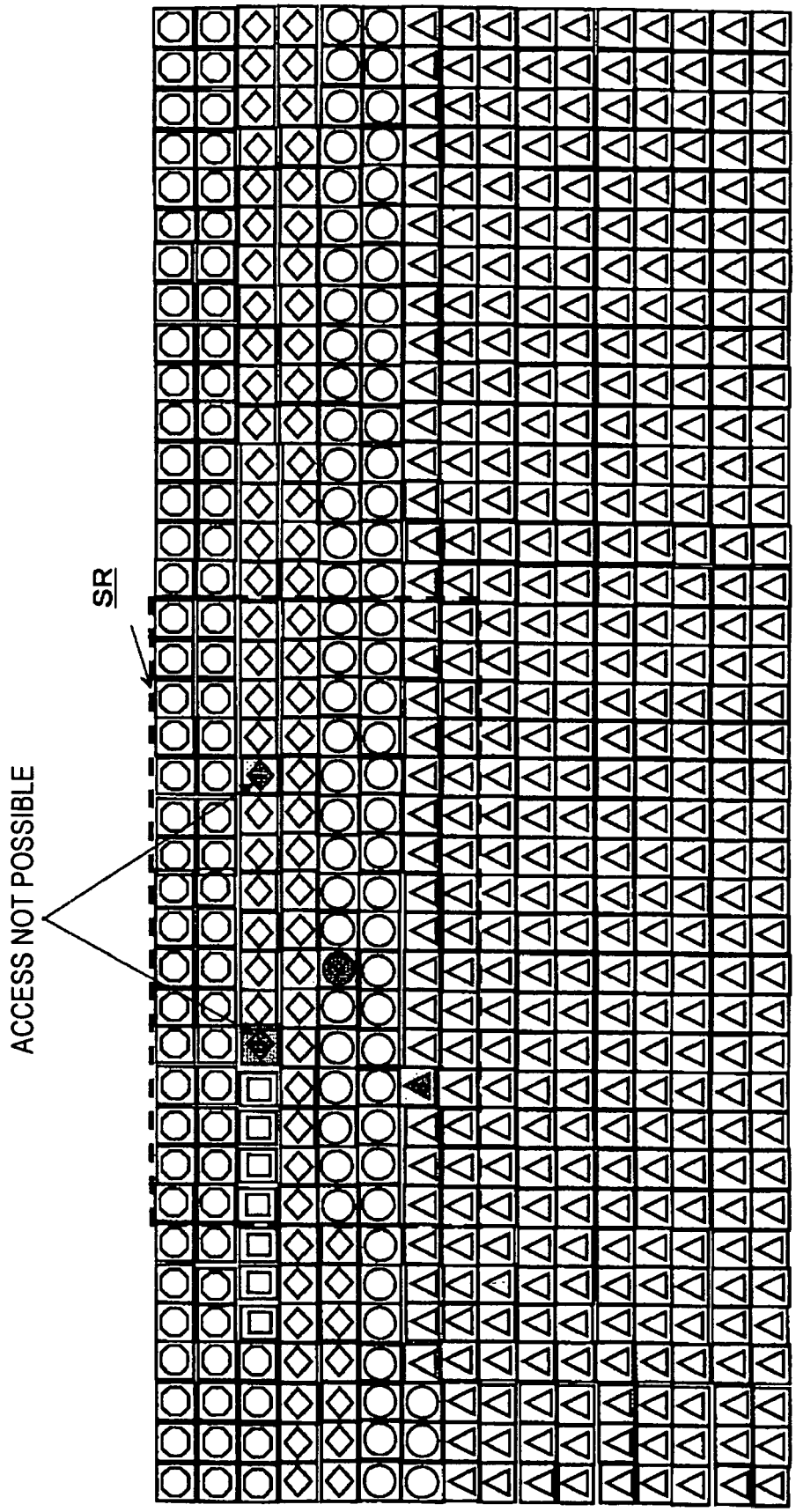
FIG. 26 is a schematic diagram showing that pixels in the same memory bank are to be simultaneously accessed if the access pattern moves into a range defined between access pixels.

FIGS. 16A, 17A, and 18A show a two-dimensional data arrangement, and FIGS. 16B, 17B, and 18B show a one-dimensional arrangement in the memory banks BK0 to BK3. In FIGS. 16A, 17A, and 18A, a number represents a bit line address number in a memory bank in which a pixel is stored.

It should be understood by those skilled in the art that various modifications, combinations, sub-combinations and alterations may occur depending on design requirements and other factors insofar as they are within the scope of the appended claims or the equivalents thereof.

What is claimed is:

1. A data storage device, comprising:
a memory including a plurality of memory banks;
a data storage processor configured to initially arrange data in the plurality of memory banks of the memory based on an access pattern which indicates positions of desired pixels, which are access candidates, so that pixels of data between the access candidates constituting the access pattern are stored in an identical memory bank, the access pattern including a plurality of the desired pixels of data to be read simultaneously; and
a data read and storage processor configured to read the data initially arranged in the plurality of memory banks of the memory so as to read pixels of data from the memory banks,
wherein the access pattern is supplied to the data storage processor and the data read and storage processor are configured to read a pixel of data from a memory bank, and store the read pixel of data in a memory bank in which pixels of data in an adjacent range are stored, the adjacent range being defined in ranges based on a direction in which the access pattern is moved, the ranges being defined by locations of the access candidates of the access pattern, and wherein the data storage processor is configured to initially arrange all of the data in the plurality of memory banks of the memory by determining whether or not a pixel of data to be stored is matched to one of the plurality of desired pixels constituting the access pattern,
when the pixel of data is matched to the access pattern, a current value of a bit line address and a current value of a word line address are stored as a write bit line address and write word line address of a current memory bank, a bank address allocated to the memory bank is incremented, and the pixel of data is stored at the incremented bank address, a number of the plurality of desired pixels constituting an access pattern is smaller than or equal to a number of the plurality of memory banks, and
when the pixel of data is not matched to one of the plurality of desired pixels constituting the access pattern, the pixel of data is stored at a current bank address at a location corresponding to the value of the bit line address being incremented.

2. The data storage device according to claim 1, wherein the data read and storage processor is configured to read a pixel of data on a word line address and a bit line address in each of the memory banks while incrementing the word line address and the bit line address.

3. The data storage device according to claim 1, wherein each of the ranges defined by locations of the access candidates of the access pattern spans from a given access candidate to a subsequent access candidate of the access candidates of the access pattern in the direction in which the access pattern is moved.

4. The data storage device according to claim 1, wherein the pixels of data in the adjacent range are pixels of data in an adjacent range in the opposite direction of the direction in which the access pattern is moved.

5. The data storage device according to claim 1, wherein the data read and storage processor is configured to read a pixel of data from a memory bank, and store the read pixel of data by overwriting the read pixel of data in a region of the memory bank from which data has already been read.

6. A data storage control apparatus, comprising:
a data storage processor configured to initially arrange data in a plurality of memory banks constituting a memory based on an access pattern which indicates positions of desired pixels, which are access candidates, so that pixels of data between the access candidates constituting the access pattern are stored in an identical memory bank, the access pattern including a plurality of the desired pixels of data to be read simultaneously; and
a data read and storage processor configured to read the data initially arranged in the plurality of memory banks of the memory so as to read pixels of data from the memory banks,
wherein the access pattern is supplied to the data storage processor and the data read and storage processor are configured to read a pixel of data from a memory bank, and store the read pixel of data in a memory bank in which pixels of data in an adjacent range are stored, the adjacent range being defined in ranges based on a direction in which the access pattern is moved, the ranges being defined by locations of the access candidates of the access pattern, and
wherein the data storage processor is configured to initially arrange all of the data in the plurality of memory banks of the memory by determining whether or not a pixel of data to be stored is matched to one of the plurality of desired pixels constituting the access pattern, when the pixel of data is matched to the access pattern, a current value of a bit line address and a current value of a word line address are stored as a write bit line address and write word line address of a current memory bank, a bank address allocated to the memory bank is incremented, and the pixel of data is stored at the incremented bank address, a number of the plurality of desired pixels constituting an access pattern is smaller than or equal to a number of the plurality of memory banks, and when the pixel of data is not matched to one of the plurality of desired pixels constituting the access pattern, the pixel of data is stored at a current bank address at a location corresponding to the value of the bit line address being incremented.

7. A data storage control method comprising the steps of:

initially arranging data in a plurality of memory banks constituting a memory based on an access pattern which indicates positions of desired pixels, which are access candidates, so that pixels of data between the access candidates constituting the access pattern are stored in an identical memory bank, the access pattern including a plurality of desired pixels of data to be read simultaneously;

reading from a memory bank a pixel of data in the data initially arranged in the plurality of memory banks of the memory; and storing the read pixel of data in a memory bank in which pixels of data in an adjacent range are stored, the adjacent range being defined in ranges based on a direction in which the access pattern is moved, the ranges being defined by locations of the access candidates of the access pattern; and arranging all of the data in the plurality of memory banks of the memory by determining whether or not a pixel of data to be stored is matched to one of the plurality of desired pixels constituting the access pattern, when the pixel of data is matched to the access pattern, storing a current value of a bit line address and a current value of a word line address as a write bit line address and write word line address of a current memory bank, incrementing a bank address allocated to the memory bank, and storing the pixel of data at the incremented bank address, a number of the plurality of desired pixels constituting an access pattern is smaller than or equal to a number of the plurality of memory banks, when the pixel of data is not matched to one of the plurality of desired pixels constituting the access pattern, storing the pixel of data at a current bank address at a location corresponding to the value of the bit line address being incremented.

8. A computer readable storage medium encoded with instructions which when executed by a computer cause the computer to execute a method, the method comprising the steps of:

initially arranging data in a plurality of memory banks constituting a memory based on an access pattern which indicates positions of desired pixels, which are access candidates, so that pixels of data between the access candidates constituting the access pattern are stored in an identical memory bank, the access pattern including a plurality of desired pixels of data to be read simultaneously;

reading from a memory bank a pixel of data in the data initially arranged in the plurality of memory banks of the memory; and storing the read pixel of data in a memory bank in which pixels of data in an adjacent range are stored, the adjacent range being defined in ranges based on a direction in which the access pattern is moved, the ranges being defined by locations of the access candidates of the access pattern; and arranging all of the data in the plurality of memory banks of the memory by determining whether or not a pixel of data to be stored is matched to one of the plurality of desired pixels constituting the access pattern, when the pixel of data is matched to the access pattern, storing a current value of a bit line address and a current value of a word line address as a write bit line address and write word line address of a current memory bank, incrementing a bank address allocated to the memory bank, and storing the pixel of data at the incremented bank address, a number of the plurality of desired pixels constituting an access pattern is smaller than or equal to a number of the plurality of memory banks, when the pixel of data is not matched to one of the plurality of desired pixels constituting the access pattern, storing the pixel of data at a current bank address at a location corresponding to the value of the bit line address being incremented.

* * * * *